US011695048B2

(12) United States Patent
Torigoe et al.

(10) Patent No.: US 11,695,048 B2
(45) Date of Patent: Jul. 4, 2023

(54) SILICON WAFER AND MANUFACTURING METHOD OF THE SAME

(71) Applicant: SUMCO CORPORATION, Tokyo (JP)

(72) Inventors: Kazuhisa Torigoe, Tokyo (JP); Toshiaki Ono, Tokyo (JP); Shunya Kawaguchi, Tokyo (JP)

(73) Assignee: SUMCO CORPORATION, Tokyo (JP)

( * ) Notice: Subject to any disclaimer, the term of this patent is extended or adjusted under 35 U.S.C. 154(b) by 153 days.

(21) Appl. No.: 17/225,422

(22) Filed: Apr. 8, 2021

(65) Prior Publication Data

US 2021/0320177 A1 Oct. 14, 2021

(30) Foreign Application Priority Data

Apr. 9, 2020 (JP) ................................ 2020-070451

(51) Int. Cl.
*C30B 33/02* (2006.01)
*H01L 29/32* (2006.01)
(Continued)

(52) U.S. Cl.
CPC ............ *H01L 29/32* (2013.01); *C30B 15/203* (2013.01); *C30B 29/06* (2013.01); *C30B 33/02* (2013.01);
(Continued)

(58) Field of Classification Search
CPC ....... C30B 16/203; C30B 29/06; C30B 33/02; H01L 21/3225; H01L 21/324
See application file for complete search history.

(56) References Cited

U.S. PATENT DOCUMENTS 6,503,594 B2   1/2003   Park
2008/0026232 A1*  1/2008   Knerer ................. H01L 21/268
                                                        438/799
(Continued)

FOREIGN PATENT DOCUMENTS

JP       2005203575   *  7/2005
JP       2006-040980       2/2006
(Continued)

OTHER PUBLICATIONS

Office Action issued in TW Patent Application No. No. 110112927, dated Feb. 22, 2022, translation.

*Primary Examiner* — Robert M Kunemund
(74) *Attorney, Agent, or Firm* — Greenblum & Bernstein, P.L.C.

(57) ABSTRACT

A silicon wafer having a layer of oxygen precipitates and method of manufacturing thereof wherein the wafer exhibiting robustness characterized as having a ratio of a first average density from a first treatment that to a second average density from a second treatment is between 0.74 to 1.02, wherein the first treatment includes heating the wafer or a portion of the wafer at about 1150° C. for about 2 minutes and then between about 950 to 1000° C. for about 16 hours, and the second treatment includes heating the wafer or a portion of the wafer at about 780° C. for about 3 hours and then between about 950 to 1000° C. for about 16 hours. The wafer exhibits heretofore unattainable uniformity wherein a ratio of an oxygen precipitate density determined from any one cubic centimeter in the BMD layer of the wafer to another oxygen precipitate density from any other one cubic centimeter in the BMD layer of the wafer is in a range of 0.77 to 1.30.

38 Claims, 11 Drawing Sheets

(51) Int. Cl.
*H01L 21/324* (2006.01)
*C30B 15/20* (2006.01)
*H01L 21/322* (2006.01)
*C30B 29/06* (2006.01)

(52) U.S. Cl.
CPC ........ *H01L 21/324* (2013.01); *H01L 21/3225* (2013.01)

(56) References Cited

U.S. PATENT DOCUMENTS

2008/0311342 A1 12/2008 Muller et al.
2010/0047563 A1 12/2010 Nakai et al.

FOREIGN PATENT DOCUMENTS

| JP | 2009-094533 | 4/2009 |
| JP | 2012-033846 | 2/2012 |
| JP | 2018-098314 | 6/2018 |
| WO | 2009/151077 | 12/2009 |

\* cited by examiner

SILICON WAFER AND MANUFACTURING METHOD OF THE SAME

CROSS-REFERENCE TO RELATED APPLICATIONS

The present application claims priority under 35 U.S.C. § 119 of Japanese Application No. 2020-070451, filed on Apr. 9, 2020, the disclosure of which being expressly incorporated by reference herein in its entirety.

BACKGROUND OF THE INVENTION

1. Field of the Invention

The present disclosure relates to a silicon wafer and manufacturing method of the same, and particularly relates to a method of heat-treating a silicon wafer that is prepared by slicing a silicon single crystal ingot produced by the Czochralski (CZ) method. In addition, the present disclosure relates to a silicon wafer that is heat-treated with this heat treatment method.

2. Description of Related Art

A large number of silicon wafers that are substrate materials for semiconductor devices are manufactured using silicon single crystal ingots produced by the CZ method. The CZ method is a method where a seed crystal that is brought into contact with a silicon melt inside a quartz crucible is gradually drawn up while rotating the seed crystal relative to the silicon melt, thereby growing a single crystal that is larger than the seed crystal. With the CZ method, a manufacturing yield of large-diameter silicon single crystals can be increased.

It is known that when a silicon single crystal is grown using the CZ method, oxygen that dissolves out of a surface of the quartz crucible is incorporated into the silicon melt. The oxygen in the silicon melt enters a supersaturated state in the process of the silicon single crystal being cooled, and the oxygen coheres, creating oxygen precipitate nuclei.

An oxygen precipitate density of a bulk silicon wafer immediately after the wafer is cut from the silicon single crystal ingot is often extremely low, and the low-density of oxygen precipitates has little effect on the characteristics of a semiconductor device. However, in the course of manufacturing a semiconductor device, various heat treatments are repeatedly performed, which may increase the density of oxygen precipitates. Oxygen precipitates present in a surface layer of the silicon wafer, which is an active region of the device, can cause deterioration of device characteristics such as junction leakage. Meanwhile, oxygen precipitates that are present in a bulk portion other than the active region of the device functions effectively as a gettering site for capturing metallic impurities that degrade device characteristics. Therefore, a high density of oxygen precipitates is preferably present in a region deeper than the surface layer (in a wafer interior) without being present on the surface layer of the silicon wafer.

In order to obtain a silicon wafer of this kind, Japanese Patent Laid-open Publication No. 2018-098314, for example, describes rapidly heating a silicon substrate to a first peak temperature by light irradiation from a halogen lamp, after which the temperature is rapidly lowered from the first peak temperature to a predetermined cooling temperature, thereby generating oxygen precipitate uniformly and at a high density in the entire silicon substrate. Japanese Patent Laid-open Publication No. 2018-098314 also describes using flashlight from a flash lamp to irradiate the silicon substrate that has been cooled to the predetermined cooling temperature and instantly heat the surface of the substrate to a second peak temperature, thereby eliminating oxygen precipitate from only the surface of the silicon substrate.

Japanese Patent Laid-open Publication No. 2012-033846 describes a method of inhibiting slip dislocation that accompanies a decrease in oxygen concentration in a surface of a silicon wafer and also of forming oxygen precipitate at a high density in a bulk portion of the wafer. Specifically, an inert gas is supplied to a front surface side of the wafer and a gas containing oxygen is supplied to a rear surface side of the wafer, the temperature is rapidly increased to a maximum attainment temperature of 1300° C. to 1400° C., and the maximum attainment temperature is sustained for a fixed amount of time, after which the temperature is rapidly decreased and, during the decrease in temperature, the inert gas is switched to an oxygen-containing gas and the oxygen-containing gas is supplied to the front surface side of the wafer. The document describes that oxygen diffuses inward on the front surface side of the silicon wafer due to the oxygen-containing gas that is supplied during the decrease in temperature. In addition, the document describes sustaining, in the middle of rapidly decreasing the temperature from the maximum attainment temperature, a temperature of 700° C. to 900° C. for a predetermined amount of time of 1 to 15 seconds to promote the inward diffusion of the oxygen.

Japanese Patent Laid-open Publication No. 2009-094533 describes using a rapid annealing device to heat-treat a wafer at a temperature of at least around 1150° C. to dissolve oxygen clusters or oxygen precipitate present inside the wafer, then cooling at a temperature decrease rate in excess of approximately 20° C./sec, after which hot annealing is performed at a temperature of approximately 950° C. to 1150° C., whereby a wafer is produced in which oxygen precipitate does not form when subjected to an oxygen precipitation treatment.

Japanese Patent Laid-open Publication No. 2006-40980 describes a wafer raw material having a bulk micro-defect (BMD) layer formed therein that contains a low density of oxygen precipitate nuclei and a denuded zone (DZ) layer formed between the BMD layer and the surface layer, and forming oxygen precipitate nuclei at a high density in the BMD layer by performing an oxygen precipitate nuclei formation treatment on the wafer raw material. In this example, the BMD layer is formed by annealing the wafer raw material for 1 to 10 hours in an Ar atmosphere at a temperature of 1000 to 1300° C. The oxygen precipitate nuclei formation treatment is, for example, rapid thermal processing in which thermal stress is applied in an inert gas or a mixed gas atmosphere of an ammonia gas and an inert gas, at a temperature of 500 to 1200° C. for 1 to 600 minutes. Alternatively, the oxygen precipitate nuclei formation treatment is, for example, a low-temperature ramping heat treatment performed in an inert gas or a mixed gas atmosphere of nitrogen or oxygen and an inert gas, at a temperature of 500 to 850° C. for 2 to 30 hours at a temperature increase rate of 0.2 to 2.0° C./min.

In recent years, attention has focused on a bipolar-CMOS-DMOS (BCD) process, in which bipolar, CMOS, and DMOS are formed on the same substrate, as a process for manufacturing a power management semiconductor device. A BCD process is accompanied by a high-temperature heat treatment, and therefore slip dislocation can readily occur on a wafer. In order to increase not only the gettering capability but also slip resistance of a silicon wafer, the oxygen precipitate density must be increased. Moreover, a DZ layer that is approximately several tens of μm deep is needed in the BCD process, and so in some cases an epitaxial film may be formed on the surface of the silicon wafer ahead of time, but an epitaxial film-formation process adds the issue of slipping that accompanies high-temperature heat treatment, oxygen precipitate is readily lost, and thermal stability of the oxygen precipitate also becomes questionable. Thus, increased density and stability of the oxygen precipitate are important issues in a silicon wafer used for a BCD process.

However, since the oxygen precipitate density is increased, in a conventional silicon wafer that only undergoes rapid thermal annealing (RTA) at a high temperature of approximately 1150° C., for example, the oxygen precipitate density changes greatly depending on a customer's subsequent heat treatment and the resulting gettering capability and wafer strength may be affected by the customer's subsequent heat treatment.

The heat treatment method for a silicon wafer described in Japanese Patent Laid-open Publication No. 2018-098314 has an extremely short low-temperature heat treatment time for generating oxygen precipitate, and therefore oxygen precipitate cannot be generated at a high density.

The heat treatment method for a silicon wafer described in Japanese Patent Laid-open Publication No. 2012-033846 is believed to generate oxygen precipitate at a high density due to a high-temperature heat treatment at 1300° C. to 1400° C. followed by a low-temperature heat treatment at 700° C. to 900° C. However, because the low-temperature heat treatment time is short (1 to 15 seconds), the oxygen precipitate is thermally unstable and can be readily lost due to a high-temperature heat treatment by a customer, or the oxygen precipitate may be further increased due to a low-temperature heat treatment by the customer.

The heat treatment method for a silicon wafer described in Japanese Patent Laid-open Publication No. 2009-094533 attempts to inhibit formation of oxygen precipitate, and because there is no low-temperature heat treatment following the high-temperature heat treatment, high-density oxygen precipitate cannot be formed stably.

According to the heat treatment method for a silicon wafer described in Japanese Patent Laid-open Publication No. 2006-40980, oxygen precipitate nuclei can be generated by rapid thermal processing following an annealing process. However, there is no low-temperature heat treatment after the rapid thermal processing, and therefore oxygen precipitate nuclei cannot be grown adequately, and the oxygen precipitate is thermally unstable. In addition, when oxygen precipitate nuclei are generated by the low-temperature ramping heat treatment that follows an annealing process, the heat treatment temperature is low, at 500 to 850° C., and therefore the oxygen precipitate generated in the wafer is thermally unstable and the oxygen precipitate density may fluctuate greatly depending on a customer's heat treatment.

SUMMARY OF THE INVENTION

Accordingly, the present disclosure provides a silicon wafer and a manufacturing method of the silicon wafer that is capable of generating a high density of thermally stable oxygen precipitate that is not affected by a customer's heat treatment.

A silicon wafer manufacturing method according to the present disclosure includes heat treatments applied to a silicon wafer in a furnace having a non-oxidizing atmosphere. Such heat treatments include a first heat treatment at a first temperature followed by a second heat treatment at a second temperature, the second temperature being lower than the first temperature. The first temperature is about 1100° C. to 1200° C. for about 1 to 30 seconds. The second temperature is about 800° C. to 975° C. for about 2 to 10 minutes. As used herein, the temperatures refer to the wafer temperature, rather than the furnace temperature. That is, heating "to" a temperature and heating "at" a temperature when describing a treatment of a wafer or a portion of a wafer both mean that the wafer or portion of the wafer referred to reaches the temperature and is maintained for any indicated time. Furthermore, except where otherwise indicated, all numbers expressing quantities used in the specification and claims are to be understood as being modified in all instances by the term "about." Unless indicated to the contrary, the numerical parameters set forth in the specification and claims are approximations that may vary depending upon the desired properties sought to be obtained by the present invention. At the very least, and not to be considered as an attempt to limit the application of the doctrine of equivalents to the scope of the claims, each numerical parameter should be construed in light of the number of significant digits and ordinary rounding conventions. Additionally, the recitation of numerical ranges within this specification is considered to be a disclosure of all numerical values and ranges within that range. For example, if a range is from about 1 to about 50, it is deemed to include, for example, 1, 7, 34, 46.1, 23.7, or any other value or range within the range.

According to the present disclosure, a high density of thermally stable oxygen precipitate nuclei can be generated to form a BMD layer of a silicon wafer by a short-duration, high-temperature heat treatment that is followed by a comparatively long-duration, low-temperature heat treatment. Accordingly, a silicon wafer, which is capable of generating a high density of thermally stable oxygen precipitate that is not affected by a customer's heat treatment, can be manufactured.

In the present disclosure, a rate of temperature decrease from the first temperature to the second temperature is preferably about 20° C./sec to 120° C./sec. Such combination of the first temperature, the rate of decrease, and the second temperature result in formation of oxygen precipitate nuclei in the silicon wafer that are thermally stable.

The silicon wafer manufacturing method according to an embodiment of the present disclosure preferably further includes forming an epitaxial film on the surface of the silicon wafer followed by the second heat treatment of the present disclosure. The epitaxial film provides an active layer on the surface of the wafer that is substantially free of crystal-originated-particle (COP) defects. The formation of epitaxial film is performed with a high-temperature heat treatment. Here, again, the second heat treatment according to the present disclosure, which follows the high-temperature heat treatment, results in a formation of oxygen precipitate nuclei that are thermally stable. Further, oxygen precipitates, formed from such nuclei during device processes involving heat, are also thermally stable, whereby any fluctuations of oxygen precipitate density therein can be greatly minimized. Accordingly, a silicon wafer made according to the present disclosure provides an active region that is free of COP defects and exhibits oxygen precipitate nuclei that are thermally stable.

A silicon wafer manufacturing method according to the present disclosure preferably further includes a third heat treatment, after the second heat treatment, at a third temperature that is higher than the second temperature. Such third temperature is about 1000° C. to 1200° C. for about 1 to 10 minutes. The third heat treatment further increases the sizes of the oxygen precipitate nuclei and allows them to achieve even greater thermal stability. Also, the third heat treatment causes out-diffusion of excess vacancies in a region below the wafer surface and forms a denuded zone that is substantially devoid of any vacancies.

In the present disclosure, a rate of temperature increase from the second temperature to the third temperature is preferably about 10° C./sec to 50° C./sec. Such combination of the second temperature, the rate of increase and the third temperature further result in highly stable oxygen precipitate nuclei and also, oxygen precipitate density, that forms the BMD layer, that is thermally robust.

The silicon wafer manufacturing method according to the present disclosure preferably further includes an epitaxial film-formation in which, after the third heat treatment, an epitaxial silicon film is formed on the surface of the silicon wafer. Thereby, a silicon wafer can be manufactured having a region having substantially no defects on the wafer surface layer. The epitaxial film-formation is accompanied by a high-temperature heat treatment, but oxygen precipitate that is latent in the silicon wafer that has undergone the second heat treatment and the third heat treatment as noted above is thermally stable, and therefore loss of oxygen precipitate due to the high-temperature heat treatment can be inhibited. Accordingly, a silicon wafer can be manufactured that not only has a region having substantially no defects on the wafer surface layer, but also includes a high density of oxygen precipitate nuclei.

In the present disclosure, an oxygen concentration of the silicon wafer prior to heat treatment in the first heat treatment is preferably at least about $7 \times 10^{17}$ atoms/cm$^3$ to $15 \times 10^{17}$ atoms/cm$^3$ (ASTM F-121, 1979). Thereby, a silicon wafer can be manufactured in which oxygen precipitate nuclei are formed at a high density.

In addition, in a silicon wafer according to the present disclosure, a ratio of an average oxygen precipitate density of a wafer after applying a low-temperature evaluation heat treatment at less than about 1000° C. relative to an average oxygen precipitate density of a wafer surface after applying a high-temperature evaluation heat treatment of about 1000° C. or more is 0.7 to 1.3.

The present disclosure can provide a silicon wafer that is capable of generating a high density of thermally stable oxygen precipitate, that forms a BMD layer, that is not affected by a customer's subsequent heat treatment.

In the present disclosure, the average oxygen precipitate density of a wafer after applying one of the low-temperature evaluation heat treatment and the high-temperature evaluation heat treatment is preferably $4 \times 10^8$/cm$^3$ to $1 \times 10^{10}$/cm$^3$. Thus, the silicon wafer according to the present disclosure contains $4 \times 10^8$/cm$^3$ or more of oxygen precipitate, and therefore gettering capability and slip resistance can be increased. Moreover, the oxygen precipitate density after heat treatment is not affected by a customer's heat treatment, and therefore reliability and manufacturing yield of a semiconductor device manufactured using the silicon wafer can be increased.

In the present disclosure, preferably the low-temperature evaluation heat treatment is a two-stage heat treatment at about 780° C. for about 3 hours and about 950° C. for about 16 hours, and the high-temperature evaluation heat treatment is a heat treatment at about 1000° C. for about 16 hours. In such a case, the high-temperature evaluation heat treatment may further include a heat treatment at about 1150° C. for about 2 minutes performed prior to the heat treatment at about 1000° C. for about 16 hours. In the silicon wafer according to the present disclosure, after either of these two kinds of evaluation heat treatments, changes in the oxygen precipitate density are small, and therefore reliability and manufacturing yield of a semiconductor device manufactured using the silicon wafer can be increased.

In the silicon wafer according to the present disclosure, an epitaxial silicon film is preferably formed on the surface of the silicon wafer. Thereby, a silicon wafer can be provided having a high-quality region having substantially no defects (DZ layer) on the wafer surface.

The present disclosure can provide a silicon wafer and a manufacturing method of the silicon wafer that is capable of generating a high density of thermally stable oxygen precipitate that is not affected by a customer's heat treatment.

BRIEF DESCRIPTION OF THE DRAWINGS

The present disclosure is further described in the detailed description which follows, in reference to the noted plurality of drawings by way of non-limiting examples of exemplary embodiments of the present disclosure, in which like reference numerals represent similar parts throughout the several views of the drawings, and wherein.

DETAILED DESCRIPTION OF THE INVENTION

The particulars shown herein are by way of example and for purposes of illustrative discussion of the embodiments of the present disclosure only and are presented in the cause of providing what is believed to be the most useful and readily understood description of the principles and conceptual aspects of the present disclosure. In this regard, no attempt is made to show structural details of the present disclosure in more detail than is necessary for the fundamental understanding of the present disclosure, the description taken with the drawings making apparent to those skilled in the art how the forms of the present disclosure may be embodied in practice.

Hereafter, preferred embodiments of the present disclosure are described in detail with reference to the attached drawings.

Figure 1:
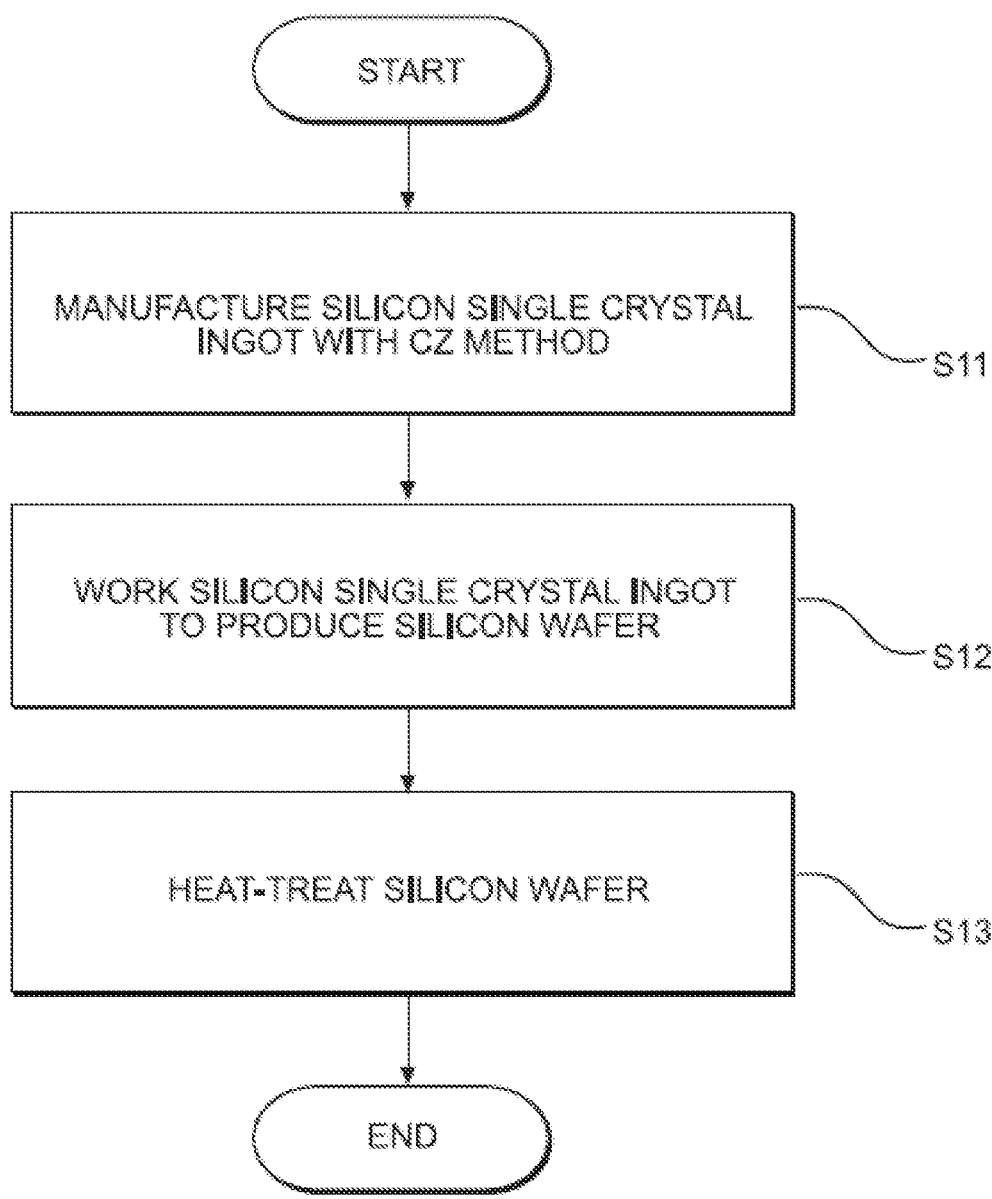
FIG. 1 is a flow chart schematically illustrating a method of manufacturing a silicon single crystal according to an embodiment of the present disclosure.

FIG. 1 is a flow chart schematically illustrating a method of manufacturing a silicon single crystal according to an embodiment of the present disclosure.

As illustrated in FIG. 1, a silicon wafer manufacturing method according to the present embodiment includes manufacturing a silicon single crystal ingot by the Czochralski (CZ) method S11, fabricating the silicon wafer from the silicon single crystal ingot S12, and heat-treating the silicon wafer S13.

In manufacturing the silicon single crystal ingot S11, polycrystalline silicon filled in a quartz crucible is heated in a CZ furnace, creating a silicon melt. Next, a seed crystal is brought into contact with the silicon melt and by gradually drawing the seed crystal up while rotating the single crystal and the quartz crucible, a large single crystal is grown on a bottom end of the seed crystal.

Next, in fabricating the silicon wafer from the silicon single crystal ingot S12, the silicon single crystal ingot is sliced with a wire saw or the like, after which the slice is lapped, etched, mirror polished, washed, and so on, completing a bulk silicon wafer (polished wafer) as an intermediate product. The oxygen concentration of a CZ silicon wafer fabricated in this way is preferably at least $7\times10^{17}$ atoms/cm$^3$ to $15\times10^{17}$ atoms/cm$^3$ (ASTM F-121, 1979).

It should be noted here that the wafer may desirably be a so-called COP-free wafer, which is a wafer substantially free of crystal-originated-particle (COP) defects. COPs are octahedral cavities crystallographically perfectly oriented, the inner wall of which typically being covered by a 1 to 4 nm thick oxide film. Vacancy related crystal defects such as COP defects can cause near-surface problems during device manufacture. Examples of the device problems are poor gate oxide integrity (GOI) and current leakage in P-N Junctions. For some device applications, a low-defect crystal growth method can be applied to reduce the number of vacancy defects in the near surface device region. Modification of the crystal pulling speed and the cooling rate of the crystal can result in lower vacancy defect levels. This allows for the recombination between vacancies and interstitials, vacancy agglomeration and oxygen control resulting in reduction of surface defects. COP-free wafers are described, for example, in US 2008/0311342, incorporated herein by reference. As described therein, the density of a "substantially COP-free" wafer means having no more than $1\times10^5$ cm$^{-3}$ agglomerates of crystal lattice vacancies.

Next, in heat-treating the silicon wafer S13, the wafer undergoes heat treatment in three stages of temperature ranges within a rapid thermal annealing (RTA) furnace, generating a high density of thermally stable oxygen precipitate nuclei. Here, the phrase "thermally stable" means that a sufficient density for gettering of metal impurities and to ensure wafer strength is maintained in a wafer shipment state and the density is not affected by subsequent heat treatment in a customer's device. In addition, "high density" refers to a density of at least $4\times10^8$/cm$^3$, preferably around $1\times10^9$/cm$^3$.

Figure 2:
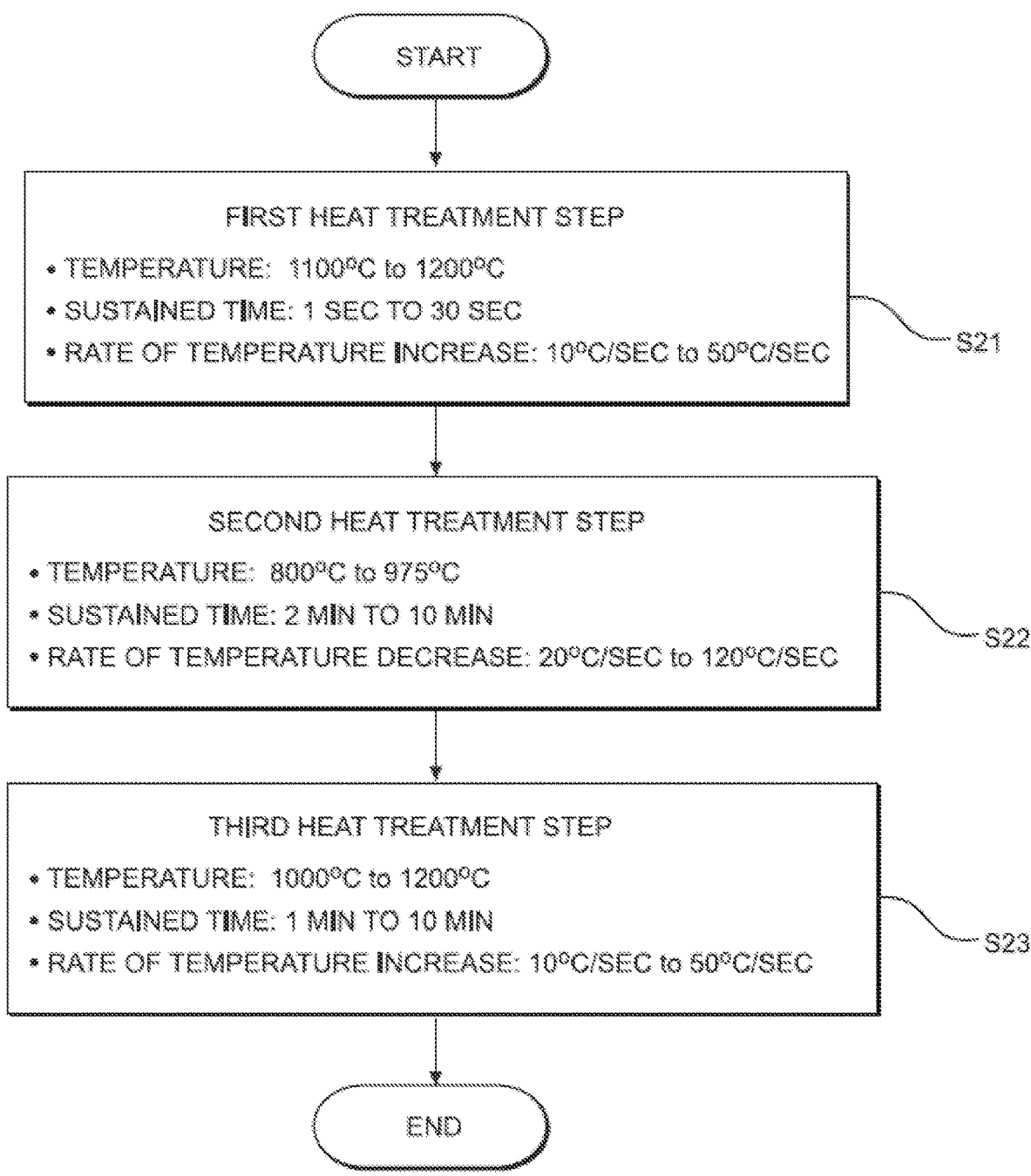
FIG. 2 is a flow chart illustrating heat treating a silicon wafer S13.
Figure 3:
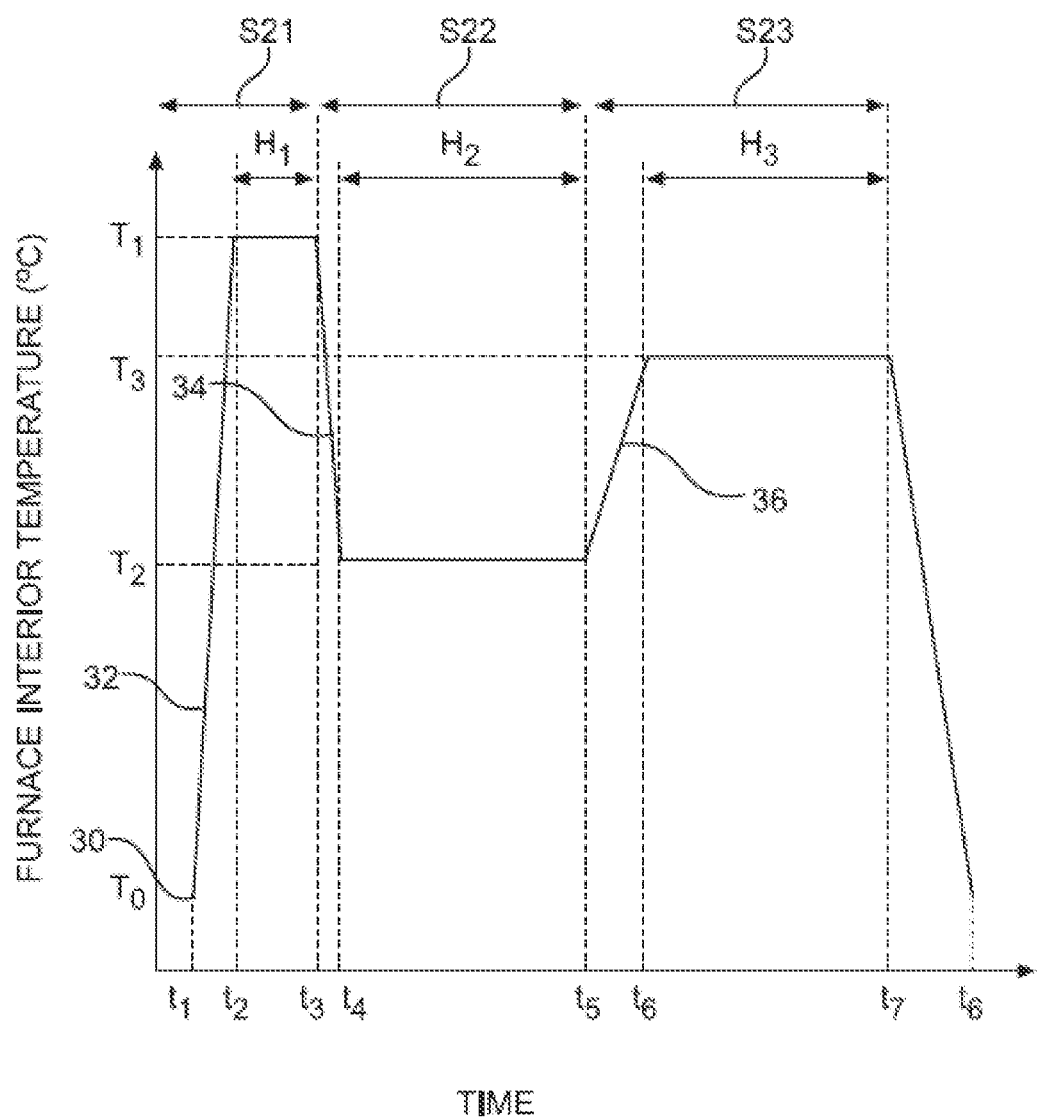
FIG. 3 is a graph illustrating temperature changes during heat treatment, with the horizontal axis representing time and the vertical axis representing heating temperature.

FIG. 2 is a flow chart illustrating heat treating the silicon wafer S13. FIG. 3 is a graph illustrating temperature changes during the heat treatment, with the horizontal axis representing time and the vertical axis representing heating temperature, respectively.

As illustrated in FIGS. 2 and 3, a method for heat treating a silicon wafer according to an embodiment of the present disclosure includes a first heat treatment S21 of heating the silicon wafer in the RTA furnace at a first temperature $T_1$; a second heat treatment S22 of heating the silicon wafer, after the first heat treatment S21, at a second temperature $T_2$ that is lower than the first temperature $T_1$; and a third heat treatment S23 of heating the silicon wafer, after the second heat treatment S22, at a third temperature $T_3$ that is higher than the second temperature $T_2$. In the present embodiment, the first to third heat treatments S21 to S23 are preferably performed continuously in the same RTA furnace. However, after the first heat treatment S21 is performed in the RTA furnace, the wafer may be removed from the RTA furnace and the second heat treatment S22 and the third heat treatment S23 may be performed in a different heat treatment device.

The first heat treatment S21 is a rapid heat treatment that is performed in an RTA furnace with a non-oxidizing atmosphere. The non-oxidizing atmosphere is preferably an inert gas containing ammonia or nitrogen, and the inert gas is preferably Ar gas. In a high-temperature heat treatment with a non-oxidizing atmosphere, a large number of voids can be introduced inside the wafer, and thereby the density of oxygen precipitate nuclei in the wafer can be increased. Furthermore, by using Ar gas containing ammonia or nitrogen, a nitrogen film forms on a wafer surface and voids can be introduced inside the wafer through the nitrogen film, and thereby the density of oxygen precipitate nuclei in the wafer can be increased.

The first temperature $T_1$ in the first heat treatment S21 is preferably about 1100° C. to 1200° C. When the first temperature $T_1$ is lower than about 1100° C., few voids are introduced inside the wafer and the benefits of high-temperature heat treatment are not sufficiently achieved, and because when the first temperature $T_1$ is higher than about 1200° C., the probability of slip dislocation occurring in the silicon wafer increases. A rate of temperature increase (32) when switching from a standby temperature $T_0$ (30) (room temperature or the like) to the first temperature $T_1$ is preferably about 10° C./sec to 50° C./sec. Minute oxygen precipitate nuclei generated during crystal growth may be present in the silicon wafer. Through a rapid heat treatment as described above, the oxygen precipitate nuclei on a surface layer of the wafer are reduced, and thereby a denuded zone (DZ) layer can be expanded.

A sustained time $H_1$ for the first temperature $T_1$ in the first heat treatment S21 is preferably about 1 to 30 seconds. When the sustained time $H_1$ for the first temperature $T_1$ is less than about 1 second, few voids are introduced inside the wafer and the benefits of high-temperature heat treatment are not sufficiently achieved, and when the sustained time $H_1$ is greater than about 30 seconds, not only is there no observable increase in the number of voids, but the probability of slip dislocation occurring increases. A large number of voids can be introduced inside the silicon wafer by the first heat treatment S21.

The second heat treatment S22 is where the silicon wafer that was heat-treated in the first heat treatment S21 is heat-treated at the second temperature $T_2$, which is lower than the first temperature $T_1$. Unlike the first heat treatment S21, the second heat treatment S22 is preferably performed in a non-oxidizing atmosphere that does not contain ammonia. Therefore, after the first heat treatment S21 ends, the atmospheric gas inside the RTA furnace is replaced.

The second temperature $T_2$ in the second heat treatment S22 is preferably about 800° C. to 975° C. This is because when the second temperature $T_2$ is less than about 800° C., thermally stable oxygen precipitate nuclei cannot be generated, and when the second temperature $T_2$ is greater than about 975° C., oxygen precipitate nuclei cannot be generated at high density. A rate of temperature decrease (34) when switching from the first temperature $T_1$ to the second temperature $T_2$ is preferably about 20° C./sec to 120° C./sec.

A sustained time $H_2$ for the second temperature $T_2$ in the second heat treatment S22 is preferably about 2 to 10 minutes. When the sustained time $H_2$ for the second temperature $T_2$ is less than about 2 minutes, the oxygen precipitate nuclei cannot be generated at high density, and when the sustained time $H_2$ is longer than about 10 minutes, cost increases without any increase in oxygen precipitate nuclei density. Oxygen precipitate nuclei can be generated stably and at high density inside the silicon wafer by the second heat treatment S22.

The third heat treatment S23 is where the silicon wafer that was heat-treated in the second heat treatment S22 is heat-treated at the third temperature $T_3$, which is higher than the second temperature $T_2$. Similar to the second heat treatment S22, the third heat treatment S23 is preferably performed in a non-oxidizing atmosphere that does not contain ammonia. The third temperature $T_3$ is preferably equal to or less than the first temperature $T_1$, and more preferably is lower than the first temperature $T_1$.

The third temperature $T_3$ in the third heat treatment S23 is preferably about 1000° C. to 1200° C. When the third temperature $T_3$ is lower than about 1000° C., the oxygen precipitate nuclei cannot achieve a thermally stable state, and when the third temperature $T_3$ is higher than about 1200° C., the probability of slip dislocation occurring increases. A rate of temperature increase (36) when switching from the second temperature $T_2$ to the third temperature $T_3$ is preferably about 10° C./sec to 50° C./sec. Thereby, the density of oxygen precipitate nuclei can be increased, and the nuclei can be made more thermally stable.

A sustained time $H_3$ for the third temperature $T_3$ in the third heat treatment step S23 is preferably about 1 to 10 minutes. This is because when the sustained time $H_3$ for the third temperature $T_3$ is less than about 1 minute, the high-density oxygen precipitate nuclei cannot become fixed, and when the sustained time $H_3$ is longer than about 10 minutes, cost increases without any particular increase in an oxygen precipitate nuclei stabilization effect. The third temperature $T_3$ is more preferably lower than the first temperature $T_1$. When the third temperature $T_3$ is greater than the first temperature $T_1$, the probability of slip dislocation occurring increases dramatically since the sustained time $H_3$ for the third temperature $T_3$ in the third heat treatment S23 is longer than the sustained time $H_1$ for the first temperature $T_1$ in the first heat treatment S21. The third heat treatment S23 can stabilize the oxygen precipitate nuclei formed in the silicon wafer and can inhibit a surplus of voids inside the wafer from diffusing out and generating surplus oxygen precipitate in a customer's subsequent heat treatment. Moreover, oxygen in the wafer surface layer is diffused out and a DZ layer having an average width (thickness) of about 10 μm or more can be formed. More preferably, the DZ has a width of about 15 to 100 μm. If the DZ width is narrower than this range, leakage current of wafers can occur. If the DZ width is too great, the resulting wafer may provide insufficient gettering ability.

Figure 4A:
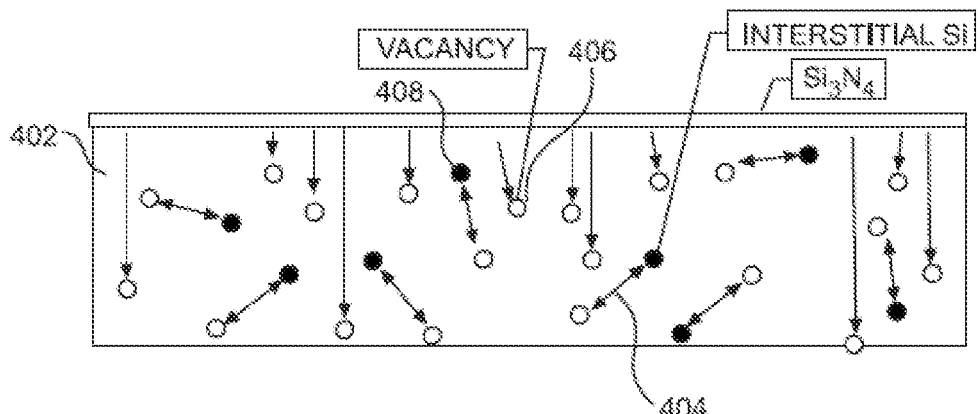
FIGS. 4A to 4F illustrate changes to a wafer that occur during and between first heat treatment S21, second heat treatment S22, and third heat treatment S23.
Figure 4B:
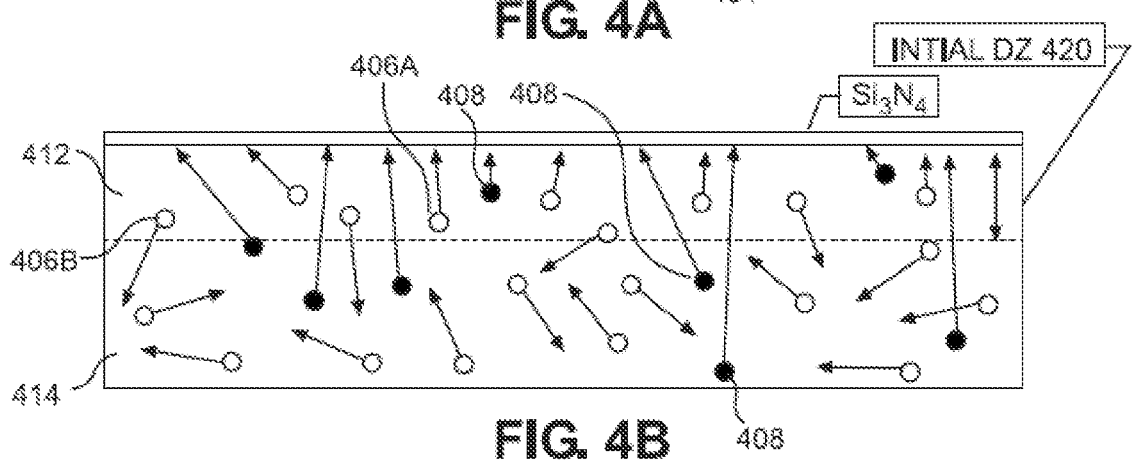
Figure 4C:
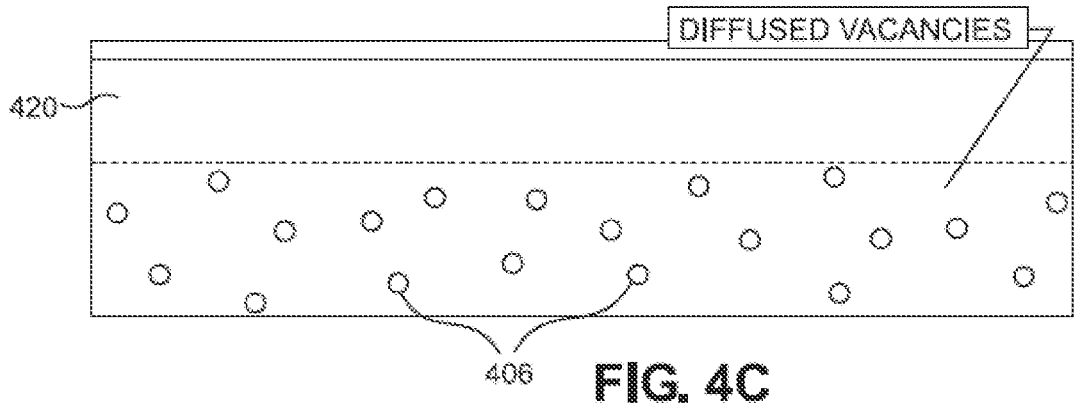
Figure 4D:
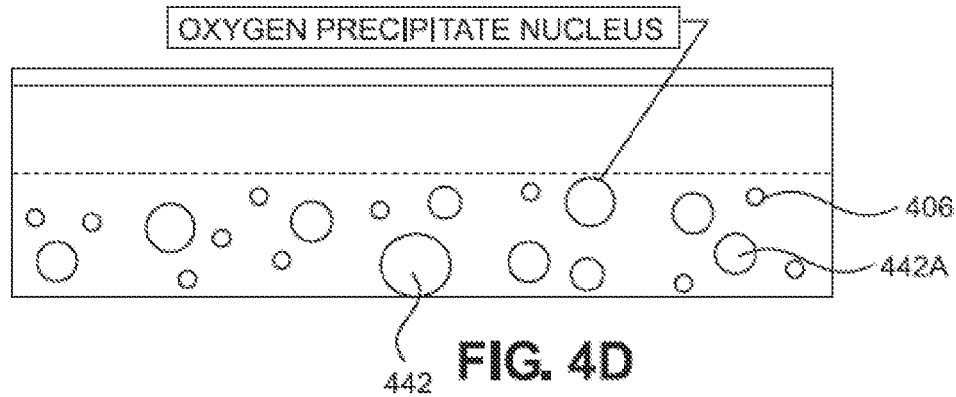
Figure 4E:
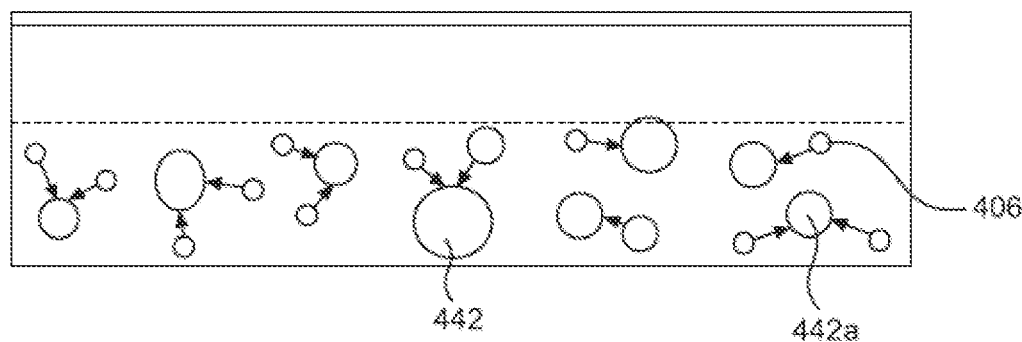
Figure 4F:
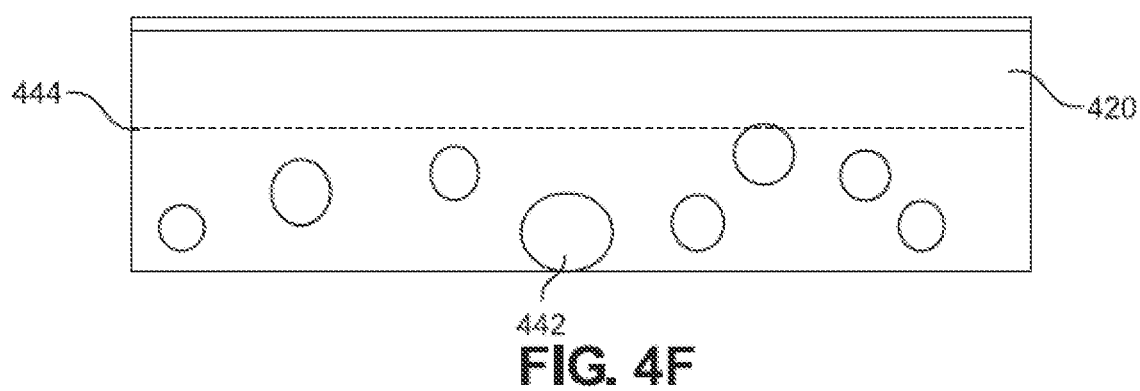
Figure 4G:
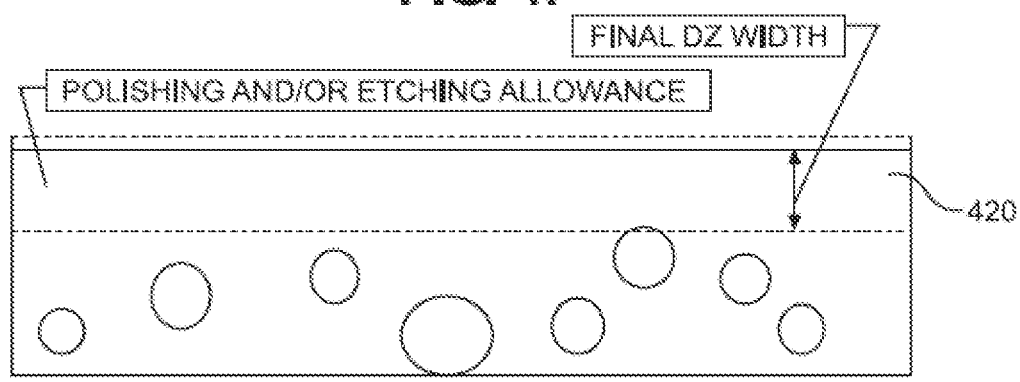
FIGS. 4G and 4H illustrate reaction in a wafer caused by heat.
Figure 4H:
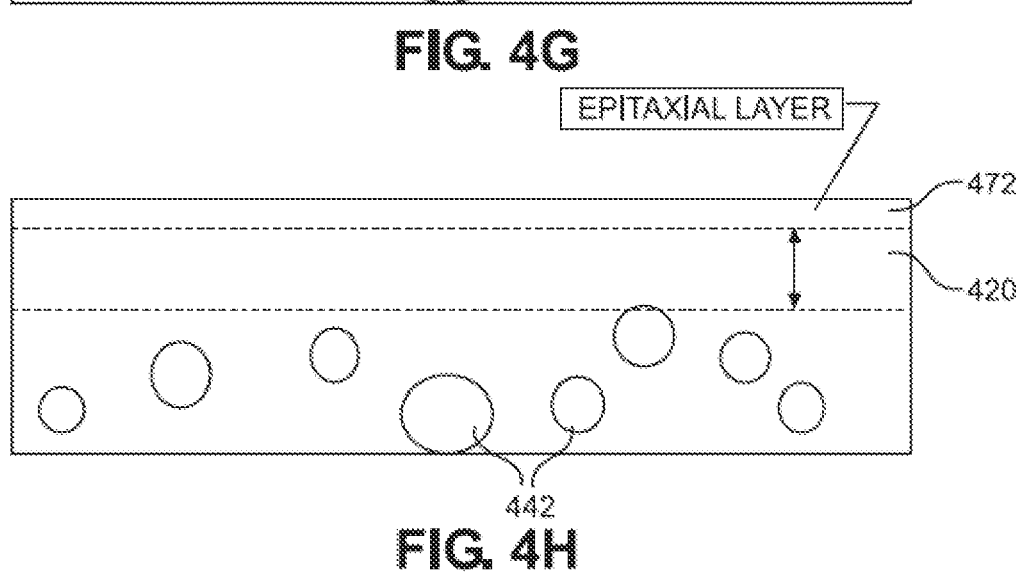

FIGS. 4A to 4F illustrate changes to a wafer (402) that occur during the above-described first heat treatment S21, second heat treatment S22, and third heat treatment S23. It is understood that during first heat treatment S21, during time $H_1$, generation of Frenkel pairs (404) of lattice vacancies and interstitial silicon atoms occurs. Additional vacancies (406) move into the wafer (402) from the interface between $Si_3N_4$ and the silicon wafer. Subsequently, during the period between $t_3$ and $t_4$, out-diffusion of interstitial Si atoms (408) and a portion of the vacancies (406a) occurs as shown in FIG. 4B, and diffusion of vacancies (406b) from an upper zone (412) of the wafer to a lower zone (414) of the wafer occurs, forming a DZ (420) as evident in FIG. 4C. Referring to FIG. 4D, during time $H_2$ of second heat treatment S22, oxygen precipitates nuclei (442) from combination of vacancies (406) are formed, wherein the nuclei reach sufficiently large sizes for stability. Some residual vacancies (406) remain, however. As shown in FIG. 4D, during the third heat treatment S23, remaining residual vacancies (406) and smaller nuclei (442a) left over at the end of $H_2$ undergo further recombination during $H_3$, leading to larger and more stable nuclei (442). This recombination is illustrated in FIG. 4E. Final formation of a DZ (420) having a preferred width (444) also occurs, as illustrated in FIG. 4F. In FIG. 4G, the $Si_3N_4$ layer has been removed by etching or polishing, and a final formation of DZ (420) having a desired width is shown. Even if the wafer has been treated to have an epitaxial layer (472) as in FIG. 4H, density of oxygen precipitation nuclei does not decrease from the epitaxial process.

Figure 5:
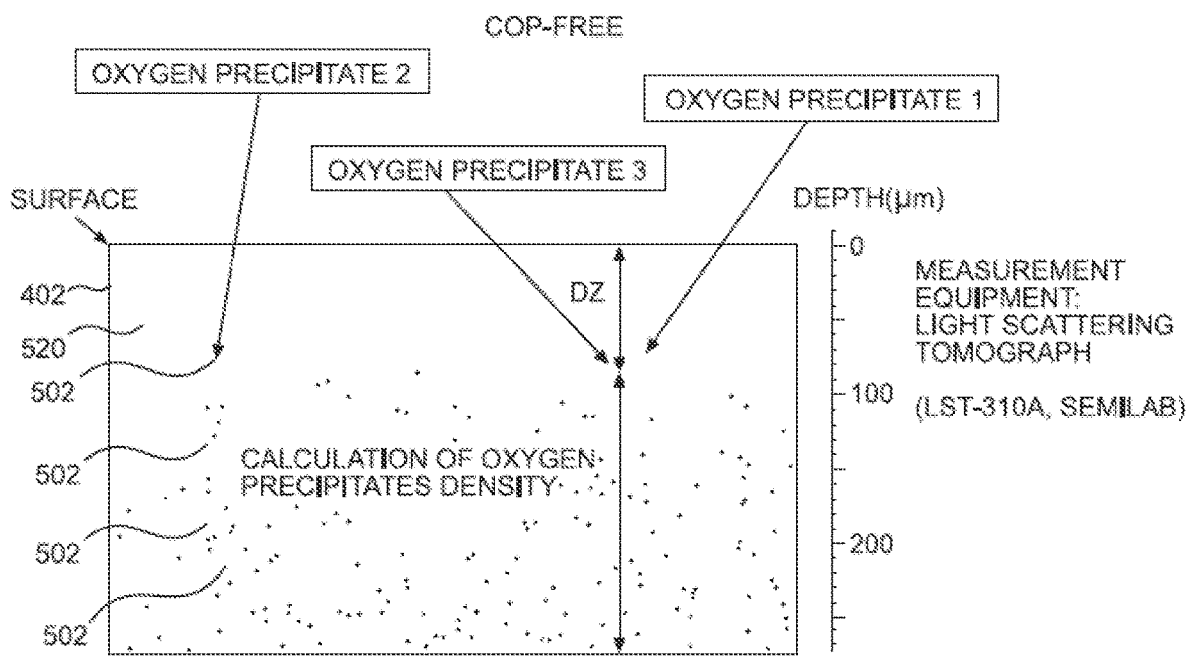
FIG. 5 graphically illustrates how a width of a denuded zone (DZ) in a wafer may be determined.

The width (depth) of the DZ is important to the wafer. If the width of the DZ is too small, leakage current in a resulting device formed on the wafer can occur. If the width of the DZ is too large, insufficient gettering property of the DZ is achieved. FIG. 5 graphically illustrates how a width of a DZ (520) is determined in a wafer, here, a COP-free wafer. The wafer may be observed using a light scattering tomograph on a cut section of wafer. The surface of the wafer is considered zero depth, and observations are made across the horizontal planar direction of the wafer in increasing width of the wafer. Each observed oxygen precipitate (502) is counted as the width increases, until three distinct oxygen precipitates are counted. At that point, the width is noted, and the DZ (520) is considered to be the depth from the surface of the wafer until the noted depth.

Figure 6:
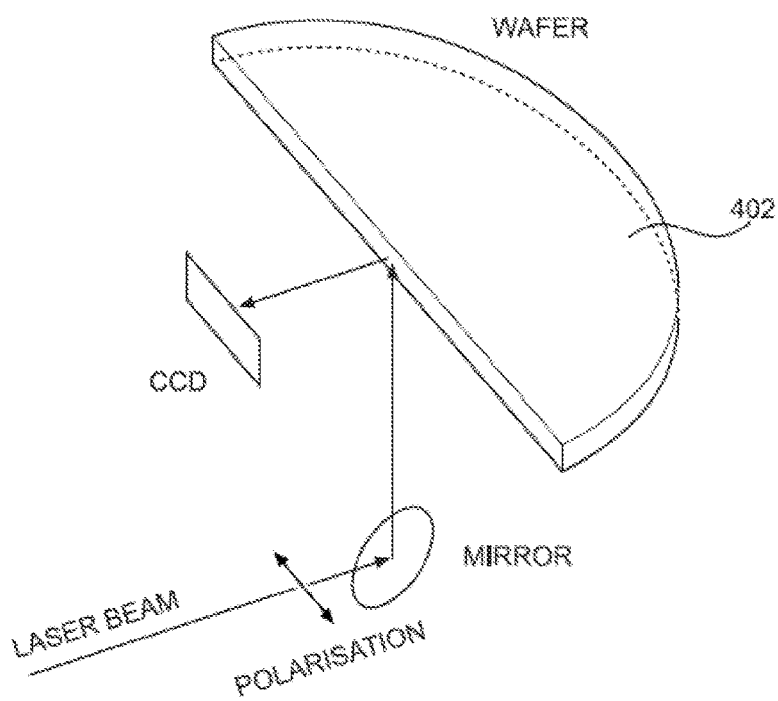
FIG. 6 illustrates a device for measurement of the BMD density of a wafer.

With regard to measurement of the BMD (oxygen precipitate) density of a wafer (402), because the inspected material is mainly silicon, proper infrared illumination light can be focused into the sample and Rayleigh-scattered light can be collected. This is illustrated in FIG. 6. A darkfield arrangement ensures that the low level scattered light suffers minimal disturbance from the defect due to the illumination. Applying low noise, highly sensitive, infrared detection, the detection limit can be as low as 12 nm. As shown in FIG. 6, the wafer is cleaved to expose its cross section, which contains the BMD layer below the DZ, and the measurement of oxygen precipitates is taken from the BMD layer (see also FIG. 5). Of course, such an evaluation is destructive to the wafer; therefore, properties associated with testing of a wafer from a batch of wafers may be ascribed to the batch of wafers. Also, throughout this application, as indicated here, a measurement of density of oxygen precipitates from a certain "location" or "point" of the BMD layer refers to counting the number of oxygen precipitates at a point or in an area on the cut surface and then determining (i.e., computing or estimating) the number of oxygen precipitates per cubic centimeter ($cm^3$).

The silicon wafer heat-treated as described above is removed from the RTA furnace and is brought to market as a so-called annealed silicon wafer. The BMD layer, which refers to the layer of oxygen precipitates in the silicon wafer, according to the present embodiment is robust. The robustness herein considers the change of oxygen precipitates (BMD) density from a lower heat treatment of less than about 1000° C. to a higher heat treatment of about 1000° C. or more, which are ranges of heat treatments during the fabrication process of semiconductor integrated circuits. That is, a ratio of the average oxygen precipitate density from the low-temperature heat treatment to the average oxygen precipitate density from the high-temperature heat treatment is 0.7 to 1.3, or that the change in the oxygen precipitate density from varying heat treatments is within 30%. Even after the silicon wafer undergoes a desired heat treatment in a semiconductor device manufacturing process, the average oxygen precipitate density in the wafer is in a range of about $4\times10^8$ to $1\times10^{10}/cm^3$, and a fluctuation ratio of this range stays within a range of ±30%, more preferably 15%, still more preferably 10%, yet more preferably 5%. In this way, the silicon wafer according to the present embodiment contains a high density of thermally stable oxygen precipitate nuclei that are not affected by a customer's heat treatment, and therefore quality and reliability of semiconductor devices such as a BCD device can be improved.

An epitaxial silicon film may also be formed on the surface of the silicon wafer that has undergone the first to third heat treatments S21 to S23. When the epitaxial silicon film is to be formed, the silicon wafer is exposed to a high temperature of around 1150° C., and therefore when the oxygen precipitate nuclei in the silicon wafer are thermally unstable, there is a chance that the oxygen precipitate nuclei will be lost and the oxygen precipitate density following heat treatment of the device will decrease substantially. However, according to the present embodiment, a decreased oxygen precipitate density can be inhibited due to the oxygen precipitate nuclei being thermally stable, and a reduction in gettering capability and wafer strength can be prevented.

Both gettering capability and slip resistance are sought in a silicon wafer for manufacturing a power semiconductor device such as a BCD device, and in order to satisfy such wafer characteristics, at least about $4\times10^8/cm^3$, and preferably about $1\times10^9/cm^3$, oxygen precipitate is believed to be needed in a silicon wafer following heat treatment of the device. For example, even with a conventional annealed silicon wafer where only a rapid heat treatment (RTA) of about 10 seconds at about 1150° C. is performed, depending on a subsequent device process, an oxygen precipitate density of about $4\times10^8/cm^3$ or more can be ensured. However, customers have diverse device processes, and when a high-temperature heat treatment such as an epitaxial growth process is performed at the initial stages of the device process, for example, oxygen precipitate density in a conventional annealed silicon wafer may fall below $4\times10^8/cm^3$ and there are large fluctuations in the oxygen precipitate density.

However, the method of manufacturing the silicon wafer according to the present embodiment generates and grows minute oxygen precipitate nuclei using a low-temperature heat treatment over a comparatively long time (about 2 to 10 minutes) directly following RTA. Therefore, the oxygen precipitate nuclei become thermally stable and when the nuclei undergo a customer's heat treatment, a high density of oxygen precipitate can be generated regardless of what type of heat treatment the customer uses. Moreover, by performing a heat treatment at about 1000 to 1200° C. for about 1 to 10 minutes, directly after the low-temperature heat treatment, the minute oxygen precipitate nuclei can be further stabilized, and surplus voids inside the wafer can diffuse out and further stabilize the oxygen precipitate nuclei density and expand the DZ layer.

The present disclosure is not limited to the embodiment above. Various modifications can be added without departing from the scope of the present disclosure, and such modifications are, of course, covered by the scope of the present disclosure.

For example, in the embodiment described above, the third heat treatment S23 is performed after the second heat treatment S22, but the third heat treatment S23 can also be omitted. As compared to a silicon wafer where the third heat treatment S23 is performed, a silicon wafer where the third heat treatment S23 is omitted has slightly inferior stability in oxygen precipitate density and DZ layer width after a device heat treatment, but nevertheless can demonstrate a greater beneficial effect than the prior art. In addition, when an epitaxial film-formation is performed after the second heat treatment S22 and the epitaxial silicon film is formed on the surface of the wafer, even when the third heat treatment S23 is omitted, a region of sufficient width having substantially no defects can be formed on the wafer surface layer while the oxygen precipitate density in the BMD layer of the wafer is increased.

Evaluation of Three-Stage Heat Treatment

A P-type silicon single crystal ingot with a diameter of 300 mm, an orientation of (100), and an oxygen concentration of $11\times10^{17}$ atom/$cm^3$ (ASTM F-121, 1979) is grown using the CZ method. A silicon wafer is produced by slicing the silicon single crystal ingot. Next, the silicon wafer is heat treated under various conditions and two annealed silicon wafer samples are produced for each of Examples A1 and A2 as well as Comparative Examples A1 and A2.

In producing the annealed silicon wafer according to Example A1, three-stage heat treatment is performed using an RTA device, in the order of first heat treatment (high temperature)→second heat treatment (low temperature)→third heat treatment (medium temperature). More specifically, feed-in at room temperature→increase temperature at 50°/sec→hold 1150° C. for 10 seconds→decrease temperature at 70° C./sec→hold 900° C. for 2 minutes→increase temperature at 50° C./sec→hold 1000° C. for 1 minute→decrease temperature at 10° C./sec→extraction at room temperature. An Ar gas containing ammonia is used as the atmospheric gas during the high-temperature heat treatment and an Ar gas not containing ammonia is used as the atmospheric gas during the low-temperature and medium-temperature heat treatments. This yields an annealed silicon wafer sample.

In producing the annealed silicon wafer according to Example A2, the third (last) heat treatment (medium temperature) is omitted, and a two-stage heat treatment is performed in the order of first heat treatment (high temperature)→second heat treatment (low temperature). The first and second heat treatment conditions are the same as in Example A1.

In producing the annealed silicon wafer according to Comparative Example A1, the second (middle) heat treatment (low temperature) is omitted, and a two-stage heat treatment is performed in the order of first heat treatment (high temperature)→third heat treatment (medium temperature). The first and third heat treatment conditions are the same as in Example A1.

In producing the annealed silicon wafer according to Comparative Example A2, the second heat treatment (low temperature) and third heat treatment (medium temperature) are omitted and a one-stage heat treatment of only the first heat treatment (high temperature) is performed. The first heat treatment conditions are the same as in Example A1.

Next, an oxygen precipitate evaluation heat treatment (high-temperature evaluation heat treatment) at a high temperature of 1000° C. or more is performed on one of the two samples of each annealed silicon wafer, and an oxygen precipitate evaluation heat treatment (low-temperature evaluation heat treatment) at a low temperature of less than 1000° C. is performed on the other sample. The high-temperature evaluation heat treatment is configured as a two-stage heat treatment performed in the order of a 2-minute heat treatment at 1150° C., mimicking an epitaxial film-formation process, and a 16-hour heat treatment at 1000° C. In addition, the low-temperature evaluation heat treatment is configured as a two-stage heat treatment performed in the order of a 3-hour heat treatment at 780° C. and a 16-hour heat treatment at 950° C.

Figure 7:
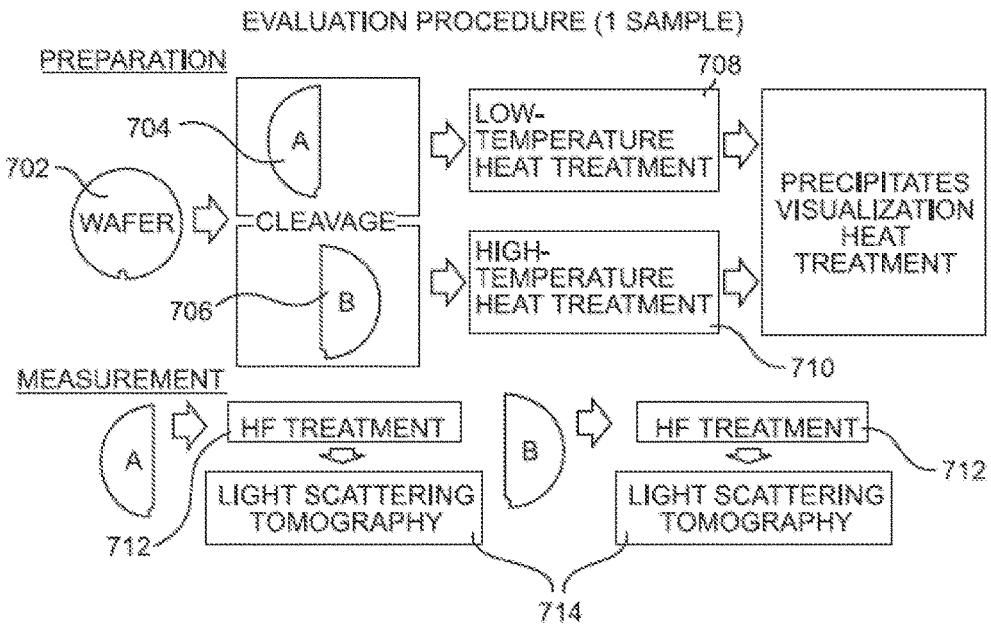
FIG. 7 graphically illustrates an evaluation procedure as used in some embodiments of the present disclosure.

FIG. 7 provides a schematic of an evaluation procedure for determining the robustness and uniformity of a wafer as produced. The evaluation procedure is destructive; therefore, properties associated with testing of a wafer from a batch of wafers may be ascribed to the batch of wafers. In preparation for one embodiment of evaluation, a wafer (702) may be cleaved in two portions, an A portion (704) and a B portion (706), with each portion undergoing its respective low-temperature evaluation heat treatment (708) or high-temperature evaluation heat treatment (710). Alternatively, two wafers from a prepared batch of wafers may be used, with the assumption that the two wafers represent the properties associated with the entire batch. Next, each of the wafer portions are subject to HF treatment (712) to remove $SiO_2$ from the surface, and then evaluation using light scattering tomography (714) to determine their distribution of oxygen precipitates density. In this manner, precipitates in each of the two portions may be evaluated to determine robustness of the wafer, that is, the ratio of resulting BMD density of each of the portions that underwent evaluation heat treatments at different temperatures and different holding times.

The low-temperature evaluation heat treatment includes heating and sustaining the first portion of the wafer at a wafer temperature of about 600 to 900° C. for about 0.5 to 5 hours, in an O2 atmosphere. The high-temperature evaluation heat treatment includes heating and sustaining the second portion of the wafer at a wafer temperature of about 1050 to 1150° C. for about 1 to 20 minutes, in an $H_2$ atmosphere.

Figure 8:
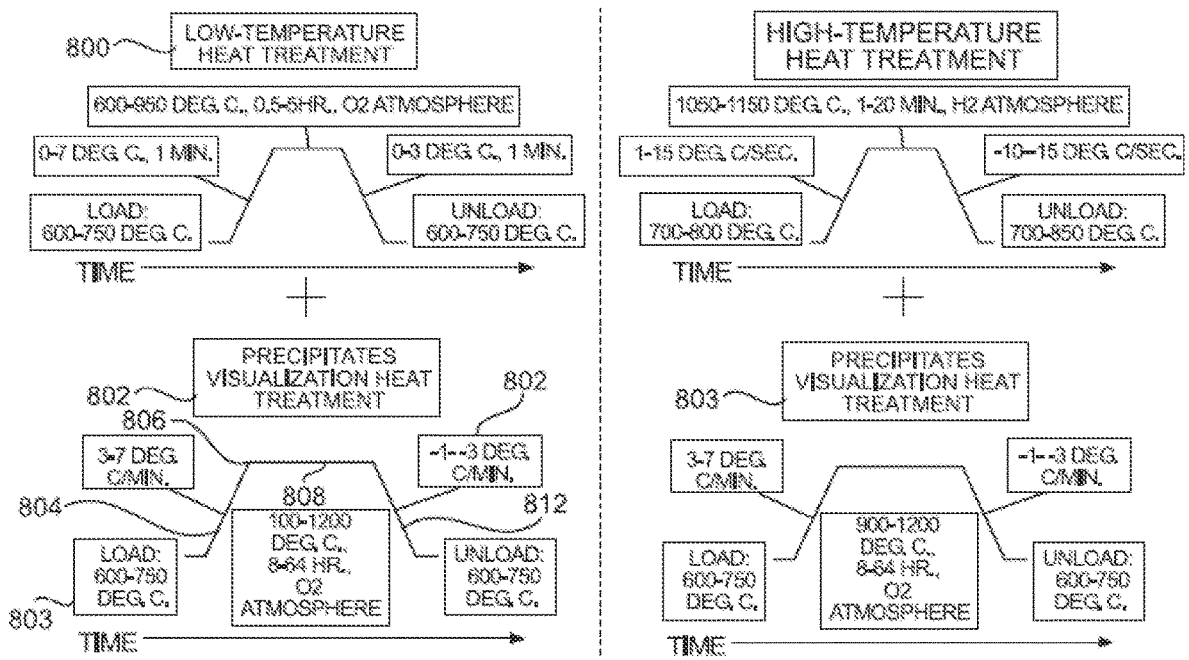
FIG. 8 graphically illustrates an evaluation heat treatment procedure as used in embodiments of the present disclosure.
Figure 9:
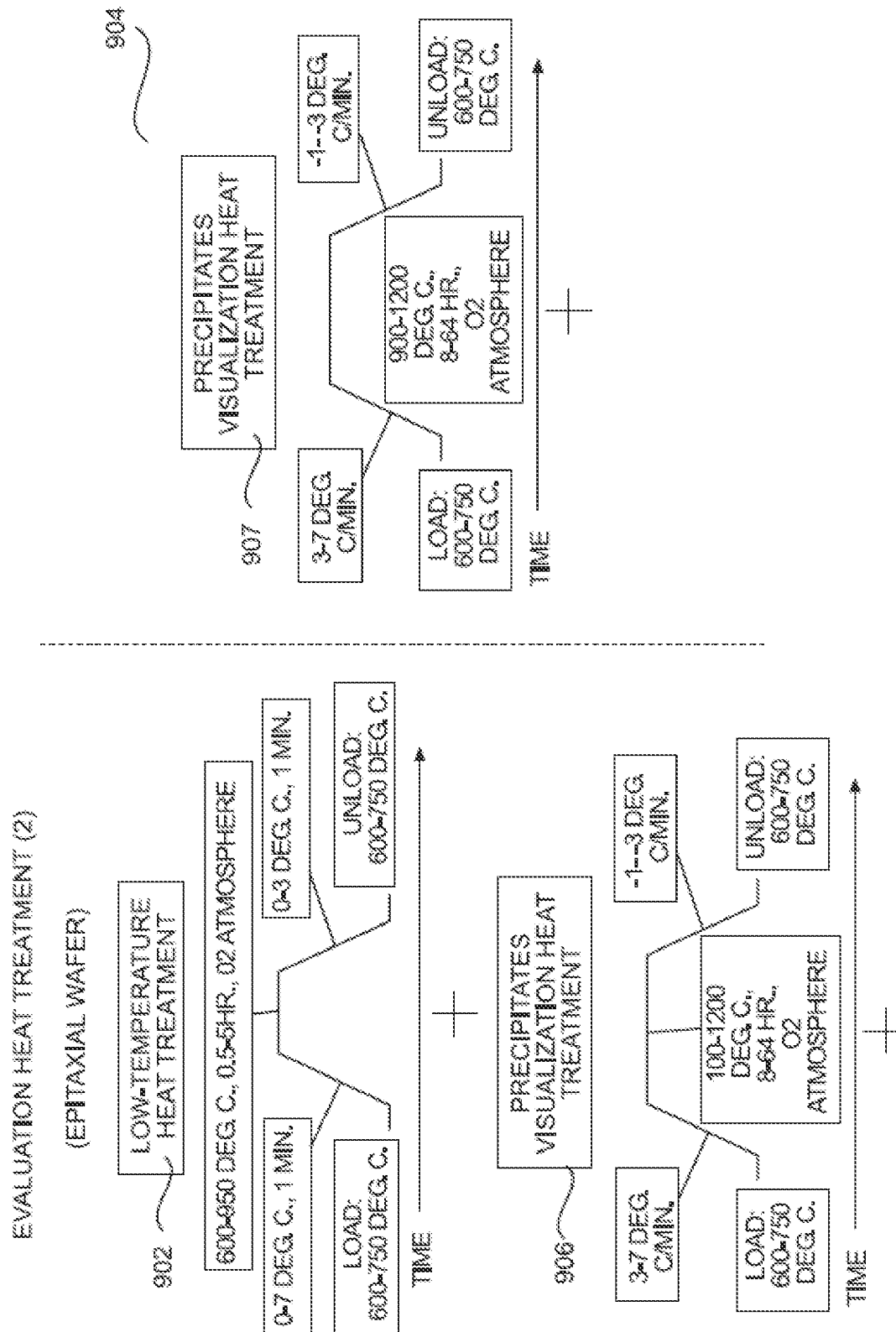
FIG. 9 graphically illustrates an alternative evaluation heat treatment procedure as used in embodiments of the present disclosure.

As shown in FIG. 8, following each of the low-temperature evaluation heat treatment (800) to one portion of the wafer and the high-temperature evaluation heat treatment (801) to another (in the case of a non-epitaxial wafer), the respective portions are subject to a precipitates visualization treatment (802, 803). Such precipitates visualization treatment (802) can include loading wafer or portion thereof in a chamber at about 600 to 750° C. (803), and thereafter heating wafer at a rate of about 3 to 7° C./minute (804) to a temperature of about 900 to 1200° C. (806). This temperature is sustained for about 8 to 64 hours (808) and then the wafer is cooled at a rate of about −1 to −3° C./minute (810) to a temperature of about 600 to 750° C. (812). The wafer is thereafter unloaded from the chamber. Note that in the case of an epitaxial wafer as shown in FIG. 9, the heat process involved in forming the epitaxial layer constitutes a high-temperature evaluation treatment. In one embodiment, as shown in FIG. 9, one portion of the epitaxial wafer is subject to the visualization treatment (906). Another portion is subject to the low-temperature evaluation treatment (902), followed by visualization treatment (907).

Next, BMD density of each sample after the evaluation heat treatment is measured by an infrared scattering tomography device as described and illustrated FIG. 6 and an average density of the oxygen precipitates in the BMD layer of the wafer surface is measured. Results are given in Table 1A.

TABLE 1A

| Sample | First heat treatment (high temp.) | | Second heat treatment (low temp.) | | Third heat treatment (medium temp.) | | BMD density after evaluation heat treatment (/cm³) | | BMD density ratio |
|---|---|---|---|---|---|---|---|---|---|
| | Temp. (° C.) | Sustained time (sec) | Temp. (° C.) | Sustained time (min) | Temp. (° C.) | Sustained time (min) | High-temp evaluation heat treatment: 1150° C./ 2 min + 1000° C./16 h | Low-temp evaluation heat treatment: 780° C./ 3 h + 950° C./16 h | |
| Example A1 | 1150 | 10 | 900 | 2 | 1000 | 1 | 8.8E+08 | 9.3E+08 | 0.95 |
| Example A2 | 1150 | 10 | 900 | 2 | N/A | N/A | 8.2E+08 | 9.8E+08 | 0.84 |
| Comp. Ex. A1 | 1150 | 10 | N/A | N/A | 1000 | 1 | 4.2E+07 | 4.7E+08 | 0.09 |
| Comp. Ex. A2 | 1150 | 10 | N/A | N/A | N/A | N/A | 4.5E+07 | 4.8E+08 | 0.09 |

As shown in Table 1A, with the annealed silicon wafer according to Example A1, the ratio of BMD average density after the high-temperature evaluation heat treatment relative to the BMD average density after the low-temperature evaluation heat treatment (BMD density ratio after evaluation heat treatments) is 0.95, which is a favorable result within the range of 0.7 to 1.3. With the annealed silicon wafer according to Example A2, as well, the BMD density ratio after evaluation heat treatment is 0.84, which is a favorable result within the range of 0.7 to 1.3. In this way, with Examples A1 and A2 in which the second heat treatment is performed after the first heat treatment, a high density of thermally stable oxygen precipitate that is not affected by a heat treatment temperature can be obtained. In particular, with Example A1 in which the third heat treatment is performed, the BMD density ratio is a favorable result close to 1.0, as compared to Example A2 in which the third heat treatment is not performed.

Meanwhile, with the annealed silicon wafer according to Comparative Examples A1 and A2, the BMD density ratio after evaluation heat treatment is 0.09, which is a result far below 0.7. The BMD density after high-temperature evaluation heat treatment is believed to be particularly low because the second heat treatment is not performed in Comparative Examples A1 and A2.

The results of the above Example A1 and Comparative Example A2 are graphically illustrated in FIG. 9. For each of these samples, the density of oxygen precipitates is plotted compared with the distance from the wafer center, following low-temperature evaluation heat treatment and high-temperature evaluation heat treatment. The plot of low-temperature evaluation heat treatment and high-temperature evaluation heat treatment for Example A1 shows that densities are generally overlapped throughout the 150 mm distance from center. This means that the wafer is robust, and was not affected by heat treatment that emulates a customer's epitaxial layer forming step. On the other hand, the plot of low-temperature evaluation heat treatment and high-temperature evaluation heat treatment for Comparative Example A2 shows that densities do not overlap at all throughout the 150 mm distance from center, with wide variations across the wafer. This means that the wafer is not robust, and was affected by heat treatment that emulates a customer's epitaxial layer forming step.

Table 1B compiles uniformity data for a wafer according to an embodiment of the present disclosure, Examples A1 and A2, and Comparative Examples COMA1 and COMA2. As in Table 1A, Examples A1 and A2 are each cleaved in two portions (i.e., cutting the wafer in any radial direction) to perform the measurement of oxygen precipitate densities in the BMD layer exposed along the cut surface. The first portion is subject to the high-temperature evaluation heat treatment followed by the visualization treatment, the second portion is subject to the low-temperature evaluation heat treatment and the visualization treatment. As shown in Table 1B, the BMD density measurements are taken throughout both portions, from their respective BMD layer, to determine a maximum (max) and a minimum (min) density from each portion. In this embodiment, the measurements are taken in any radial direction from center to edge of the wafer at about a 5-mm interval (i.e., 30 measurements for a 300 mm wafer) to determine oxygen precipitate densities, each measurement computing a number of oxygen precipitates per $cm^3$, in the BMD layer. In Table 1B, the uniformity is determined by taking the ratio of max/min for each sample. As shown, the uniformity for Example A1 is 1.27 for the whole wafer considering the max/min ratio from each of the two portions therein. Similarly, Example A2 provides BMD uniformity of 1.26. Therefore, for Examples A1 and A2, the difference between the maximum and minimum BMD densities is within about 27% and 26%, respectively. By contrast, both COMA1 and COMA2 show a significantly larger uniformity of 10.9 and 9.17, respectively. It should be noted that the ratio max/min in Table 1B considers the uniformity of the worst case; it follows that, a density of oxygen precipitates taken from the BMD layer of such wafer in any location (i.e., a measurement point) along the cut surface should be within 27% of another density taken from any other location of the BMD layer.

TABLE 1B

| | Uniformity | | |
|---|---|---|---|
| Sample | High-temp density, max/min | Low-temp density, max/min | Highest max/min on the wafer |
| Example A1 | 1.27 | 1.22 | 1.27 |
| Example A2 | 1.25 | 1.26 | 1.26 |
| Example COMA1 | 10.9 | 1.27 | 10.9 |
| Example COMA2 | 9.17 | 1.29 | 9.17 |

Figure 10:
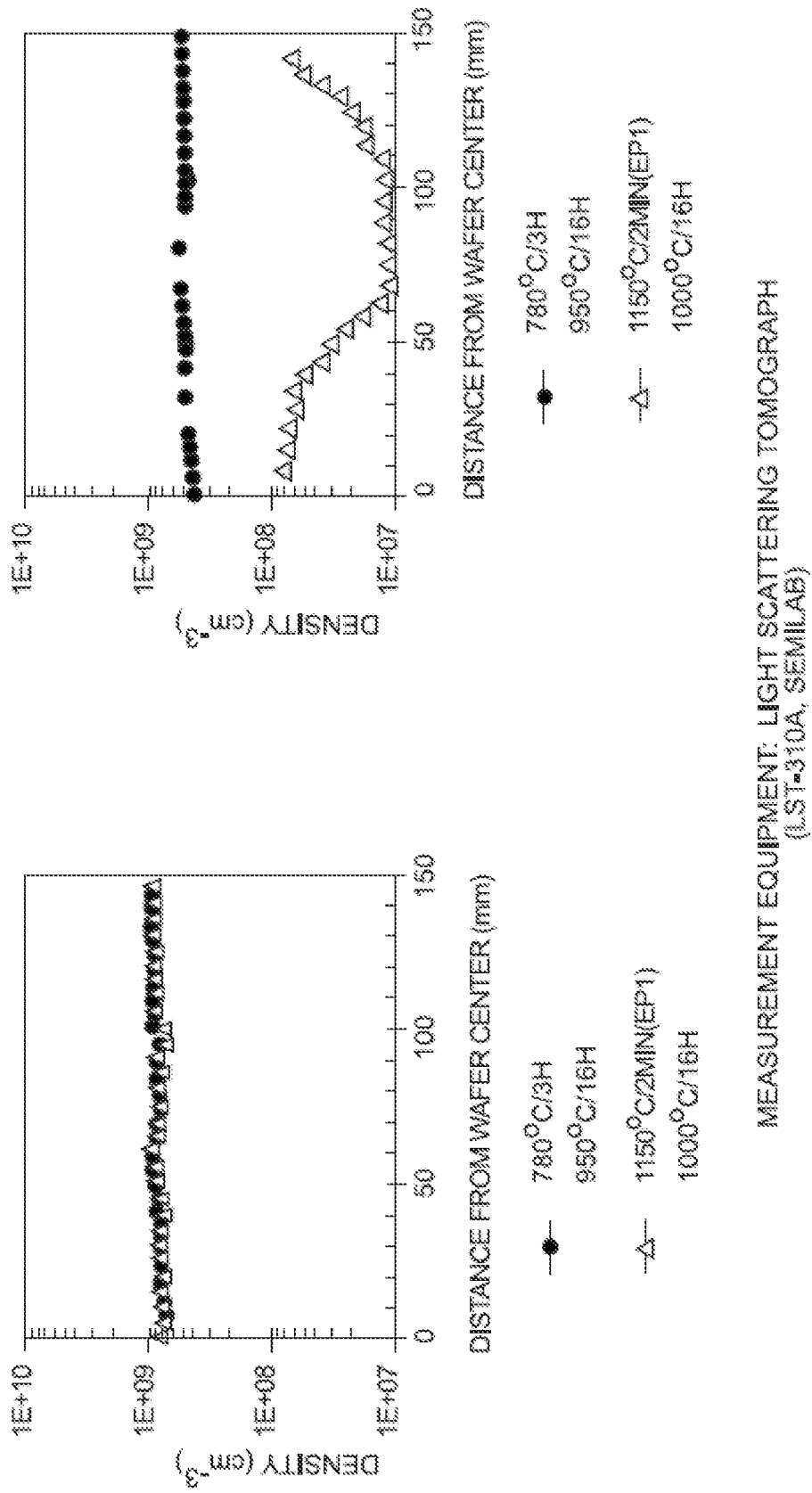
FIG. 10 is two plots showing distribution of oxygen precipitates density of an Example of the present disclosure and of a Comparative Example.

The results of the uniformity for Example A1 and Comparative Example A2 are also graphically illustrated in FIG. 10. The graph for Example A1 (on the left) shows that the BMD densities for both the high-temperature and low-temperature evaluation heat treatments are generally similar (i.e., robust) and horizontal (i.e., uniform) throughout the 150 mm distance from center. On the other hand, the graph for Comparative Example A2 (on the right) shows BMD densities for high-temperature evaluation heat treatment deviate significantly from those for low-temperature evaluation heat treatment, indicating very poor robustness throughout the 150 mm distance from the center. Also, at least in the case of high-temperature evaluation heat treatment, the BMD densities show a high degree of fluctuation, indicating very poor uniformity throughout the 150 mm from the center.

Evaluation of First Heat Treatment Conditions

An effect on the BMD density of a wafer after oxygen precipitate evaluation heat treatment that differences in sustained temperature in the first heat treatment of the three-stage heat treatment described above may have is evaluated. Results are given in Table 2A.

TABLE 2A

| | First heat treatment (high temp.) | | Second heat treatment (low temp.) | | Third heat treatment (medium temp.) | | BMD density after evaluation heat treatment (/cm³) | | |
|---|---|---|---|---|---|---|---|---|---|
| | | | | | | | High-temp evaluation heat treatment: 1150° C./ 2 min + 1000° C./16 h | Low-temp evaluation heat treatment: 780° C./ 3 h + 950° C./16 h | |
| Sample | Temp. (° C.) | Sustained time (sec) | Temp. (° C.) | Sustained time (min) | Temp. (° C.) | Sustained time (min) | | | BMD density ratio |
| Example B1 | 1100 | 10 | 900 | 5 | 1000 | 1 | 4.2E+08 | 4.8E+08 | 0.88 |
| Example B2 | 1150 | 10 | 900 | 5 | 1000 | 1 | 8.3E+08 | 9.3E+08 | 0.89 |
| Example B3 | 1200 | 10 | 900 | 5 | 1000 | 1 | 2.5E+10 | 3.0E+10 | 0.83 |
| Comp. Ex. B1 | 1050 | 10 | 900 | 5 | 1000 | 1 | 3.2E+07 | 1.0E+08 | 0.32 |
| Comp. Ex. B2 | 1250 | 10 | 900 | 5 | 1000 | 1 | 3.2E+10 | 3.7E+10 | 0.86 |

In producing an annealed silicon wafer according to Example B1, the sustained temperature in the first heat treatment is 1100° C. and the sustained time is 10 seconds. As a result, the BMD density ratio after evaluation heat treatment is 0.88, which is a favorable result within the range of 0.7 to 1.3.

In producing an annealed silicon wafer according to Example B2, the sustained temperature in the first heat treatment is 1150° C., and in producing an annealed silicon wafer according to Example B3, the sustained temperature in the first heat treatment is 1200° C. As a result, the BMD density ratio after evaluation heat treatment of the annealed silicon wafer according to Example B2 is 0.89, and the BMD density ratio after evaluation heat treatment of the annealed silicon wafer according to Example B3 is 0.85, which are both favorable results within the range of 0.7 to 1.3.

Meanwhile, in the annealed silicon wafer according to Comparative Example B1, in which the sustained temperature in the first heat treatment is 1050° C., the BMD density ratio after evaluation heat treatment is 0.32, which is a result far below 0.7. In addition, in the annealed silicon wafer according to Comparative Example B2, in which the sustained temperature in the first heat treatment is 1250° C., the BMD density ratio after evaluation heat treatment is 0.86, but slip dislocation from a remnant of the contact between the wafer and a pin supporting the wafer in the RTA furnace occurs.

Table 2B compiles uniformity data for wafers according to an embodiment of the present disclosure, Examples B1, B2, and B3, and a Comparative Example COMB1. As in Table 2A, the Example wafers B1, B2, and B3 are each cleaved in two portions. The first portion is subject to the high-temperature evaluation heat treatment followed by the visualization treatment, the second portion to the low-temperature evaluation heat treatment and the visualization treatment. As shown in Table 2B, the BMD density measurements are taken throughout both portions, from their respective BMD layer, to determine a maximum and a minimum density from each portion. In this embodiment, the measurements are taken in any radial direction from center to edge of the wafer at about a 5-mm interval (i.e., 30 measurements for a 300 mm wafer) to determine oxygen precipitate densities, each measurement computing a number of oxygen precipitates per $cm^3$, in the BMD layer. In Table 2B, again, the uniformity is computed by taking the ratio of max/min for each sample. As shown, the uniformity for all three Examples B1, B2, and B3 ranges from 1.24 to 1.27. Therefore, for all three samples, Examples B1, B2, and B3, the difference between the maximum and minimum BMD densities is within about 27%. By contrast, Example COMB1 shows a significantly larger uniformity of 11.0. Again, it should be noted that the ratio max/min in Table 2B considers the uniformity of the worst case; it follows that, a density of oxygen precipitates taken from the BMD layer of such wafer in any location (i.e., a measurement point) along the cut surface should be within 27% of another density taken from any other location of the BMD layer.

TABLE 2B

| | Uniformity | | |
|---|---|---|---|
| Sample | High-temp density, max/min | Low-temp density, max/min | Highest max/min on the wafer |
| Example B1 | 1.27 | 1.23 | 1.27 |
| Example B2 | 1.24 | 1.20 | 1.24 |
| Example B3 | 1.26 | 1.26 | 1.26 |
| Example COMB1 | 11.0 | 10.8 | 11.0 |

Evaluation of Second Heat Treatment Conditions

Effects on the BMD density of a wafer after oxygen precipitate evaluation heat treatment due to differences in sustained temperature and sustained time in the second heat treatment in the three-stage heat treatment described above are evaluated. Results are shown in Table 3A.

TABLE 3A

| Sample | First heat treatment (high temp.) | | Second heat treatment (low temp.) | | Third heat treatment (medium temp.) | | BMD density after evaluation heat treatment (/cm³) | | BMD density ratio |
| --- | --- | --- | --- | --- | --- | --- | --- | --- | --- |
| | Temp. (° C.) | Sustained time (sec) | Temp. (° C.) | Sustained time (min) | Temp. (° C.) | Sustained time (min) | High-temp evaluation heat treatment: 1150° C./ 2 min + 1000° C./16 h | Low-temp evaluation heat treatment: 780° C./ 3 h + 950° C./16 h | |
| Example C1 | 1150 | 10 | 800 | 2 | 1000 | 1 | 5.3E+08 | 7.2E+08 | 0.74 |
| Example C2 | 1150 | 10 | 800 | 10 | 1000 | 1 | 6.5E+08 | 7.7E+08 | 0.84 |
| Example C3 | 1150 | 10 | 900 | 2 | 1000 | 1 | 8.8E+08 | 9.3E+08 | 0.95 |
| Example C4 | 1150 | 10 | 900 | 10 | 1000 | 1 | 9.0E+08 | 1.1E+09 | 0.82 |
| Example C5 | 1150 | 10 | 975 | 2 | 1000 | 1 | 7.1E+08 | 8.3E+08 | 0.86 |
| Example C6 | 1150 | 10 | 975 | 10 | 1000 | 1 | 7.5E+08 | 9.1E+08 | 0.82 |
| Comp. Ex. C1 | 1150 | 10 | 775 | 2 | 1000 | 1 | 2.4E+08 | 6.1E+08 | 0.39 |
| Comp. Ex. C2 | 1150 | 10 | 775 | 10 | 1000 | 1 | 3.1E+08 | 6.5E+08 | 0.48 |
| Comp. Ex. C3 | 1150 | 10 | 1000 | 2 | 1000 | 1 | 1.5E+08 | 6.1E+08 | 0.25 |
| Comp. Ex. C4 | 1150 | 10 | 1000 | 10 | 1000 | 1 | 1.7E+08 | 6.6E+08 | 0.26 |
| Comp. Ex. C5 | 1150 | 10 | 800 | 1 | 1000 | 1 | 2.2E+08 | 5.8E+08 | 0.38 |
| Comp. Ex. C6 | 1150 | 10 | 975 | 1 | 1000 | 1 | 2.7E+08 | 6.0E+08 | 0.45 |

In producing an annealed silicon wafer according to Example C1, the sustained temperature in the second heat treatment is 800° C. and the sustained time is 2 minutes. In Example C2, the sustained temperature is 800° C. and the sustained time is 10 minutes. In Example C3, the sustained temperature is 900° C. and the sustained time is 2 minutes, and in Example C4, the sustained temperature is 900° C. and the sustained time is 10 minutes. In Example C5, the sustained temperature is 975° C. and the sustained time is 2 minutes, and in Example C6, the sustained temperature is 975° C. and the sustained time is 10 minutes. As a result, the BMD density ratio after evaluation heat treatment for all of Examples C1 to C6 is favorable and within the range of 0.7 to 1.3.

Meanwhile, in Comparative Example C1, the sustained temperature is 775° C. and the sustained time is 2 minutes, and in Comparative Example C2, the sustained temperature is 775° C. and the sustained time is 10 minutes. In Comparative Example C3, the sustained temperature is 1000° C. and the sustained time is 2 minutes, and in Comparative Example C4, the sustained temperature is 1000° C. and the sustained time is 10 minutes. In Comparative Example C5, the sustained temperature is 800° C. and the sustained time is 1 minute. Also, in Comparative Example C6, the sustained temperature is 975° C. and the sustained time is 1 minute. As a result, the BMD density ratio after evaluation heat treatment for all of Comparative Examples C1 to C6 falls below 0.7.

In the foregoing, when the sustained temperature in the second heat treatment is in a range of 800 to 975° C. and the sustained time is in a range of 2 to 10 minutes, the BMD density ratio after evaluation heat treatment can be kept within the range of 0.7 to 1.3 and a high density of thermally stable oxygen precipitate that is not affected by a heat treatment temperature can be obtained.

Table 3B compiles uniformity data for wafers according to an embodiment of the present disclosure, Examples C1 through C6, and Comparative Examples COMC1 through COMC6. As in Table 3A, the sample wafers are each cleaved in two portions. The first portion is subject to the high-temperature evaluation heat treatment followed by the visual treatment, the second portion to the low-temperature evaluation heat treatment and the visual treatment. As shown in Table 3B, the BMD density measurements are taken throughout both portions, from their respective BMD layer, to determine a maximum and a minimum density from each portion. In this embodiment, the measurements are taken in any radial direction from center to edge of the wafer at about a 5-mm interval (i.e., 30 measurements for a 300 mm wafer) to determine oxygen precipitate densities, each measurement computing a number of oxygen precipitates per cm³, in the BMD layer. In Table 3B, again, the uniformity is computed by taking the ratio of max/min for each sample. As shown, the uniformity for all sample wafers according to the present disclosure ranges from 1.24 to 1.30. Therefore, for all Examples C1 through C6, the difference between the maximum and minimum BMD densities is within about 30%. By contrast, Comparative Examples COMC1 through COMC6 show a significantly larger range of uniformities between 2.13 and 17.3. Again, it should be noted that the ratio max/min in Table 3B considers the uniformity of the worst case; it follows that, a density of oxygen precipitates taken from the BMD layer of such wafer in any location (i.e., a measurement point) along the cut surface should be within 30% of another density taken from any other location of the BMD layer.

TABLE 3B

| | Uniformity | | |
| --- | --- | --- | --- |
| Sample | High-temp density, max/min | Low-temp density, max/min | Highest max/min on the wafer |
| Example C1 | 1.25 | 1.22 | 1.25 |
| Example C2 | 1.26 | 1.26 | 1.26 |
| Example C3 | 1.27 | 1.22 | 1.27 |
| Example C4 | 1.27 | 1.30 | 1.30 |
| Example C5 | 1.22 | 1.24 | 1.24 |
| Example C6 | 1.24 | 1.23 | 1.24 |
| Example COMC1 | 2.25 | 1.90 | 2.25 |
| Example COMC2 | 2.13 | 1.82 | 2.13 |
| Example COMC3 | 13.3 | 3.14 | 13.3 |
| Example COMC4 | 17.3 | 2.92 | 17.3 |

TABLE 3B-continued

| | Uniformity | | |
|---|---|---|---|
| Sample | High-temp density, max/min | Low-temp density, max/min | Highest max/min on the wafer |
| Example COMC5 | 2.27 | 2.14 | 2.27 |
| Example COMC6 | 2.31 | 1.97 | 2.31 |

Evaluation of Third Heat Treatment Conditions

Effects on the BMD density of a wafer after oxygen precipitate evaluation heat treatment due to differences in sustained temperature and sustained time in the third heat treatment in the three-stage heat treatment described above are evaluated. Results are shown in Table 4A.

TABLE 4A

| | First heat treatment (high temp.) | | Second heat treatment (low temp.) | | Third heat treatment (medium temp.) | | BMD density after evaluation heat treatment (/cm³) | | |
|---|---|---|---|---|---|---|---|---|---|
| | | | | | | | High-temp evaluation heat treatment: | Low-temp evaluation heat treatment: | |
| Sample | Temp. (° C.) | Sustained time (sec) | Temp. (° C.) | Sustained time (min) | Temp. (° C.) | Sustained time (min) | 1150° C./ 2 min + 1000° C./16 h | 780° C./ 3 h + 950° C./16 h | BMD density ratio |
| Example D1 | 1150 | 10 | 800 | 2 | 1000 | 1 | 5.3E+08 | 7.2E+08 | 0.74 |
| Example D2 | 1150 | 10 | 800 | 2 | 1000 | 10 | 5.3E+08 | 6.7E+08 | 0.79 |
| Example D3 | 1150 | 10 | 800 | 2 | 1100 | 1 | 5.3E+08 | 7.1E+08 | 0.75 |
| Example D4 | 1150 | 10 | 800 | 2 | 1100 | 10 | 5.6E+08 | 6.6E+08 | 0.85 |
| Example D5 | 1150 | 10 | 800 | 2 | 1200 | 1 | 5.3E+08 | 6.6E+08 | 0.80 |
| Example D6 | 1150 | 10 | 800 | 2 | 1200 | 10 | 5.9E+08 | 6.9E+08 | 0.86 |
| Comp. Ex. D1 | 1150 | 10 | 800 | 2 | 990 | 1 | 4.8E+08 | 1.1E+09 | 0.44 |
| Comp. Ex. D2 | 1150 | 10 | 800 | 2 | 990 | 10 | 5.0E+08 | 1.1E+09 | 0.45 |

In producing an annealed silicon wafer according to Example D1, the sustained temperature in the third heat treatment is 1000° C. and the sustained time is 1 minute. In Example D2, the sustained temperature is 1000° C. and the sustained time is 10 minutes. In Example D3, the temperature is 1100° C. and the sustained time is 1 minute, and in Example D4, the sustained temperature is 1100° C. and the sustained time is 10 minutes. In Example D5, the sustained temperature is 1200° C. and the sustained time is 1 minute, and in Example D6, the sustained temperature is 1200° C. and the sustained time is 10 minutes. As a result, the BMD density ratio after evaluation heat treatment for all of Examples D1 to D6 is favorable and within the range of 0.7 to 1.3.

Meanwhile, in Comparative Example D1, the sustained temperature is 990° C. and the sustained time is 1 minute, and in Comparative Example D2, the sustained temperature is 990° C. and the sustained time is 10 minutes. As a result, in Comparative Examples D1 and D2, the BMD density ratio after evaluation heat treatment falls below 0.7.

In the foregoing, when the sustained temperature in the third heat treatment is in a range of 1000 to 1200° C. and the time a low temperature is sustained is in a range of 1 to 10 minutes, the BMD density ratio after evaluation heat treatment can be kept within the range of 0.7 to 1.3 and a high density of thermally stable oxygen precipitate that is not affected by a heat treatment temperature can be obtained.

Table 4B compiles uniformity data for another set of wafers according to an embodiment of the present disclosure, Examples D1 through D6, and Comparative Examples COMD1 and COMD2. As in Table 4A, the sample wafers are each cleaved in two portions. The first portion is subject to the high-temperature evaluation heat treatment followed by the visual treatment, the second portion to the low-temperature evaluation heat treatment and the visual treatment. As shown in Table 4B, the BMD density measurements are taken throughout both portions, from their respective BMD layer, to determine a maximum and a minimum density from each portion. In this embodiment, the measurements are taken in any radial direction from center to edge of the wafer at about a 5-mm interval (i.e., 30 measurements for a 300 mm wafer) to determine oxygen precipitate densities, each measurement computing a number of oxygen precipitates per $cm^3$, in the BMD layer. In Table 4B, again, the uniformity is computed by taking the ratio of max/min for each sample. As shown, the uniformity for all sample wafers according to an embodiment of the present disclosure ranges from 1.23 to 1.27. Therefore, for all Examples D1 through D6, the difference between the maximum and minimum BMD densities is within about 27%. Table 4B shows that COMD2 have acceptable uniformity at 1.27. It shows that these wafers of different RTA conditions set forth in Table 4A may satisfy the desired level of uniformity but not the desired level of robustness (see Table 4A). Again, it should be noted that the ratio max/min in Table 4B considers the uniformity of the worst case; it follows that, a density of oxygen precipitates taken from the BMD layer of such wafer in any location (i.e., a measurement point) along the cut surface should be within 27% of another density taken from any other location of the BMD layer.

TABLE 4B

| | Uniformity | | |
|---|---|---|---|
| Sample | High-temp density, max/min | Low-temp density, max/min | Highest max/min on the wafer |
| Example D1 | 1.25 | 1.22 | 1.25 |
| Example D2 | 1.23 | 1.25 | 1.25 |
| Example D3 | 1.25 | 1.27 | 1.27 |
| Example D4 | 1.24 | 1.24 | 1.24 |
| Example D5 | 1.23 | 1.22 | 1.23 |

TABLE 4B-continued

| | Uniformity | | |
|---|---|---|---|
| Sample | High-temp density, max/min | Low-temp density, max/min | Highest max/min on the wafer |
| Example D6 | 1.25 | 1.26 | 1.26 |
| Example COMD1 | 1.23 | 1.29 | 1.29 |
| Example COMD2 | 1.27 | 1.24 | 1.27 |

Table 5A illustrates BMD robustness for a COP-free wafer according to an embodiment of the present disclosure. This table compiles robustness data for a set of 7 COP-free wafer samples. The high-temperature treatment includes heating the wafer at about 1150° C. for about 2 minutes. The visualization treatment includes heating the wafer at about 950-1000° C. for about 16 hours. The low-temperature treatment includes heating the wafer at about 780° C. for about 3 hours. In one embodiment, the wafer may be cleaved in two portions. First, the high-temperature treatment followed by the visualization treatment is applied to a first portion of the wafer which then facilitates multiple measurements of the oxygen precipitate (BMD) density of the first portion. Such measurements are taken at various points from center to edge of the first portion of the wafer and averaged (A). Secondly, the low-temperature treatment is applied to a second portion of the wafer, followed by the visualization treatment, and then the BMD density of the second portion is measured, again, at various points from center to edge of the second portion of the wafer and averaged (B). These samples show that the robustness of the COP-free wafer of the presentation invention, represented by the ratio A/B, is between 0.82 and 1.02, or that A is within 2 to 18% of B.

TABLE 5A

| | Robustness for COP-free wafer | | |
|---|---|---|---|
| Sample | Average BMD density ($\times 10^9/cm^3$) following high-temperature and visualization treatments (A) | Average BMD density ($\times 10^9/cm^3$) following low-temperature and visualization treatments (B) | Ratio (A/B) |
| Example 1 | 0.88 | 0.93 | 0.95 |
| Example 2 | 0.84 | 0.94 | 0.89 |
| Example 3 | 0.90 | 1.10 | 0.82 |
| Example 4 | 4.30 | 4.70 | 0.91 |
| Example 5 | 4.90 | 4.80 | 1.02 |
| Example 6 | 5.30 | 5.70 | 0.93 |

Table 5B illustrates BMD uniformity for a COP-free wafer according to an embodiment of the present disclosure. As in Table 5A, in one embodiment, the wafer may be cleaved in two portions; the high-temperature and visualization treatments are applied to the first portion and low-temperature and visualization treatments are applied to the second portion; multiple measurements of BMD density are taken throughout the first and second portions, from their respective BMD layer, and the maximum (max) and minimum (min) densities are determined therefrom. In this embodiment, the measurements are taken in any radial direction from center to edge of the wafer at about a 5-mm interval (i.e., 30 measurements for a 300 mm wafer) to determine oxygen precipitate densities, each measurement computing a number of oxygen precipitates per $cm^3$, in the BMD layer. The uniformity is determined as the ratio of max/min. These samples show that the uniformity of the COP-free wafer ranges from 1.24 to 1.33, or uniformity of 24% to 33% overall. Again, it should be noted that the ratio max/min in Table 5B considers the uniformity of the worst case; it follows that, a density of oxygen precipitates taken from the BMD layer of such wafer in any location (i.e., a measurement point) along the cut surface should be within 33% of another density taken from any other location of the BMD layer.

TABLE 5B

| | Uniformity for COP-free wafer | | |
|---|---|---|---|
| Sample | High-temp density, max/min | Low-temp density, max/min | Highest max/min on the wafer |
| Example 1 | 1.27 | 1.22 | 1.27 |
| Example 2 | 1.24 | 1.33 | 1.33 |
| Example 3 | 1.27 | 1.30 | 1.30 |
| Example 4 | 1.26 | 1.21 | 1.26 |
| Example 5 | 1.23 | 1.29 | 1.29 |
| Example 6 | 1.23 | 1.24 | 1.24 |

Figure 11:
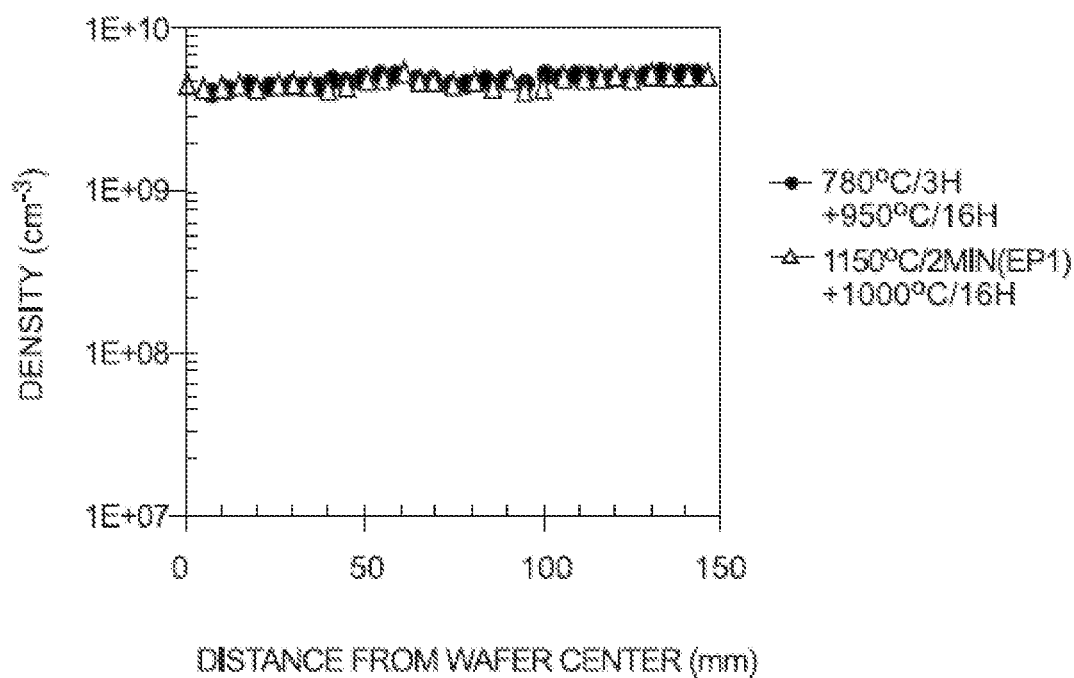
FIG. 11 is a graphical illustration of the robustness and uniformity for a COP-free wafer of an embodiment of the present disclosure, Example 5, as compiled in Table 5A and 5B.

FIG. 11 is a graphical illustration of the robustness and uniformity for a COP-free wafer according to an embodiment of the present disclosure, Example 5, as compiled in Table 5A and 5B. As shown, the BMD density in the COP-free wafer remains nearly unchanged through high and low-temperature applications and the level of density from center to edge of the wafer is highly uniform, without much detectable variances.

Table 6A illustrates BMD robustness for an epitaxial wafer according to an embodiment of the present disclosure. This table compiles robustness data for a set of 6 epitaxial wafer samples, wherein the heat treatment for forming the epitaxial layer ranges from about 1050 to 1150° C. for either 1, 2, or 5 minutes. These heating durations result in epitaxial thicknesses of 2, 4, and 10 μm, respectively. The visualization treatment herein includes heating the wafer at about 1000° C. for about 16 hours. The low-temperature treatment includes heating the wafer at about 780° C. for about 3 hours. In one embodiment, the wafer may be cleaved in two portions. First, the visualization treatment is applied to a first portion of the epitaxial wafer which then facilitates multiple measurements of BMD density of the first portion. Such measurements are taken at various points from center to edge of the first portion of the wafer and averaged (A). Secondly, the low-temperature treatment is applied to a second portion of the wafer, followed by the visualization treatment as described above, and then BMD density of the second portion is measured from, again, at various points from center to edge of the second portion of the wafer and averaged (B). These samples show that the robustness of the epitaxial wafer of an embodiment of the present disclosure, represented by the ratio A/B, is between 0.92 to 0.97, or that A is within 3 to 8% of B.

TABLE 6A

Robustness for epitaxial wafer

| Sample | Epitaxial treatment (° C./min) | Epitaxial thickness (μm) | Average BMD density (×10⁸/cm³) following visualization treatment (A) | Average BMD density (×10⁸/cm³) following low temperature and visualization treatments (B) | Ratio (A/B) |
|---|---|---|---|---|---|
| Ex. 1 | 1050/1 | 2 | 8.1 | 8.7 | 0.93 |
| Ex. 2 | 1050/2 | 4 | 8.2 | 8.5 | 0.96 |
| Ex. 3 | 1050/5 | 10 | 8.5 | 8.8 | 0.97 |
| Ex. 4 | 1150/1 | 2 | 8.1 | 8.8 | 0.92 |
| Ex. 5 | 1150/2 | 4 | 8.3 | 8.8 | 0.94 |
| Ex. 6 | 1150/5 | 10 | 8.1 | 8.7 | 0.93 |

Table 6B compiles uniformity data for an epitaxial wafer according to an embodiment according to the present disclosure. As in Table 6A, in one embodiment, the wafer may be cleaved in two portions; the visualization treatment is applied to the first portion and the low-temperature and visualization treatments are applied to the second portion; multiple measurements of BMD density are taken throughout the first and second portions, from their respective BMD layer, and the maximum (max) and minimum (min) densities are determined therefrom. In this embodiment, the measurements are taken in any radial direction from center to edge of the wafer at about a 5-mm interval (i.e., 30 measurements for a 300 mm wafer) to determine oxygen precipitate densities, each measurement computing a number of oxygen precipitates per cubic centimeter, in the BMD layer. The uniformity is determined as the ratio of max/min. These samples show that the uniformity of the epitaxial wafer ranges from 1.25 to 1.26 or 25% to 26% overall. Again, it should be noted that the ratio max/min in Table 6B considers the uniformity of the worst case; it follows that, a density of oxygen precipitates taken from the BMD layer of such wafer in any location (i.e., a measurement point) along the cut surface should be within 26% of another density taken from any other location of the BMD layer. The uniformity data shown herein are very much within the desired range of 0.77 to 1.30 and ensure that the density of oxygen precipitates taken from any one location of the BMD layer is within 30% of another density taken from any other location.

TABLE 6B

Uniformity for epitaxial wafer

| Sample | High-temp density, max/min | Low-temp density, max/min | Highest max/min on the wafer |
|---|---|---|---|
| Example 1 | 1.26 | 1.24 | 1.26 |
| Example 2 | 1.26 | 1.22 | 1.26 |
| Example 3 | 1.25 | 1.25 | 1.25 |
| Example 4 | 1.25 | 1.22 | 1.25 |
| Example 5 | 1.26 | 1.25 | 1.26 |
| Example 6 | 1.26 | 1.24 | 1.26 |

Figure 12:
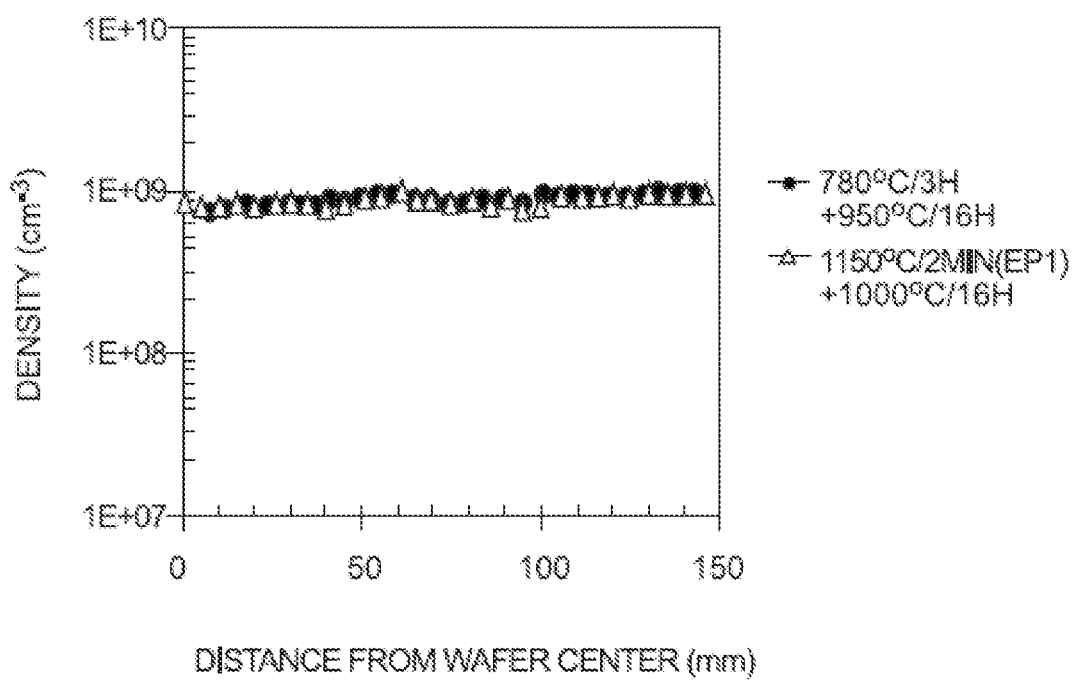
FIG. 12 is a graphical illustration of the robustness and uniformity for an epitaxial wafer of an embodiment of the present disclosure, Example 5, as compiled in Table 6A and 6B.

FIG. 12 is a graphical illustration of the robustness and uniformity for an epitaxial wafer according to an embodiment of the present disclosure, Example 5, as compiled in Table 6A and 6B. As shown, the BMD density in the epitaxial wafer remains nearly unchanged through high and low-temperature applications and the level of density from center to edge of the wafer is highly uniform without much detectable variances.

Figure 13A:
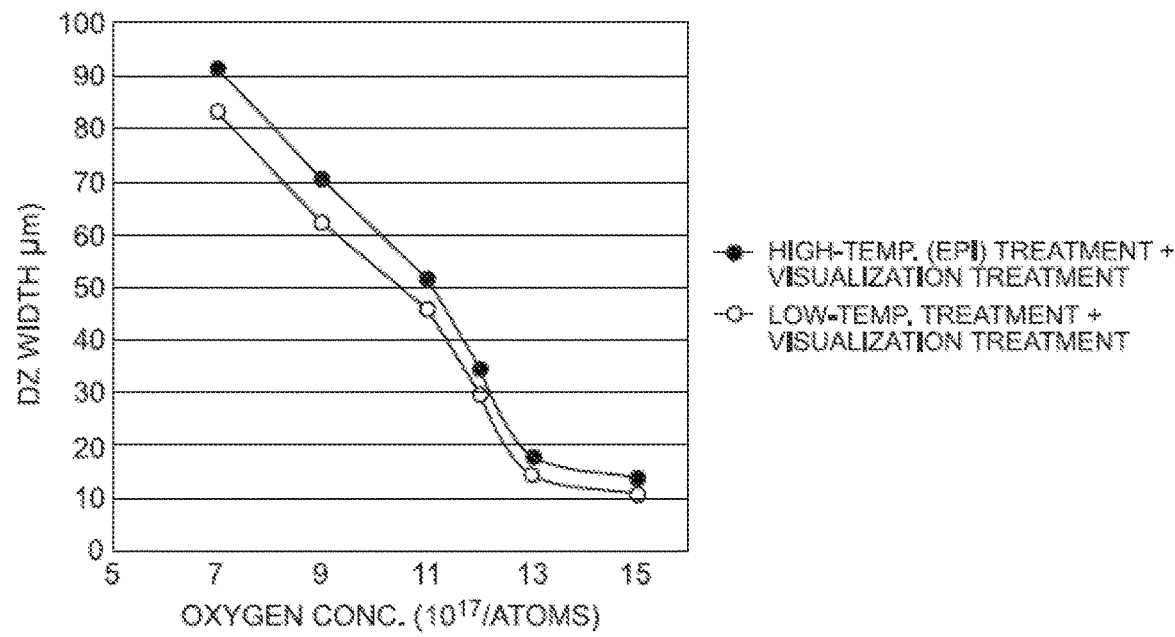
FIG. 13A depicts a relationship between the oxygen concentration and the denuded zone (DZ) of a wafer according to an embodiment of the present disclosure.
Figure 13B:
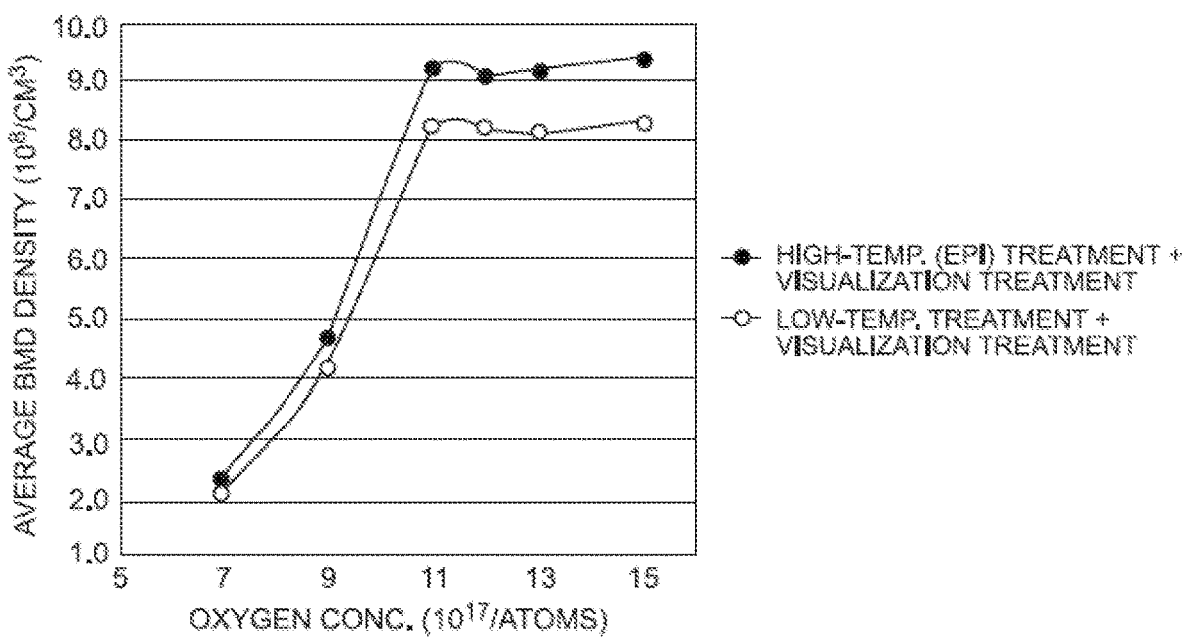
FIG. 13B depicts a relationship between the oxygen concentration and the average BMD density of a wafer according to an embodiment of the present disclosure.

FIG. 13A depicts a relationship between oxygen concentration and the denuded zone (DZ) of a wafer according to an embodiment of the present disclosure. FIG. 13B depicts a relationship between oxygen concentration and the average BMD density of a wafer according to an embodiment of the present disclosure. FIG. 13B show that high oxygen concentration helps to produce higher BMD densities for both high-temperature and low-temperature treatments. However, FIG. 13A shows that there is a trade-off, in that high oxygen concentration forces smaller and perhaps undesirable DZ widths. In general, DZ width of 15 μm or greater is preferred. FIG. 13A shows a DZ range between about 11 to 92 μm, however, a preferable range should be between about 15 to 90 μm.

It is noted that the foregoing examples have been provided merely for the purpose of explanation and are in no way to be construed as limiting of the present disclosure. While the present disclosure has been described with reference to exemplary embodiments, it is understood that the words which have been used herein are words of description and illustration, rather than words of limitation. Changes may be made, within the purview of the appended claims, as presently stated and as amended, without departing from the scope and spirit of the present disclosure in its aspects. Although the present disclosure has been described herein with reference to particular structures, materials and embodiments, the present disclosure is not intended to be limited to the particulars disclosed herein; rather, the present disclosure extends to all functionally equivalent structures, methods and uses, such as are within the scope of the appended claims.

The present disclosure is not limited to the above described embodiments, and various variations and modifications may be possible without departing from the scope of the present disclosure.

What is claimed is:

1. An epitaxial wafer comprising:
an epitaxial layer; and
a bulk micro defect (BMD) layer in which a ratio of a first average density of oxygen precipitates from a visualization treatment to a second average density of oxygen precipitates from a second treatment is in a range of about 0.92 to 0.97,
wherein the visualization treatment includes heating the wafer at about 950 to 1000° C. for 16 hours, and the second treatment includes heating the wafer at about 780° C. for 3 hours and then about 950 to 1000° C. for 16 hours.

2. The epitaxial wafer of claim 1 wherein a second ratio of the second average density to the first average density is in a range of about 1.04 to 1.09.

3. The epitaxial wafer of claim 1 wherein the epitaxial layer has a width in a range of about 2 to 10 μm.

4. The epitaxial wafer of claim 3 further comprising a denuded zone between the BMD layer and the epitaxial layer.

5. The epitaxial wafer of claim 4 wherein a combined width of the epitaxial layer and the denuded zone is in a range of about 15 to 90 μm.

6. The epitaxial wafer of claim 1 wherein a ratio of a maximum density of oxygen precipitates to a minimum density of oxygen precipitates is in a range of about 1.25 to 1.30, wherein each of the maximum density and the minimum density is taken along any radial direction from center to edge of the wafer at an interval of about 5 mm in the BMD layer.

7. The epitaxial wafer of claim 1 wherein the visualization treatment includes heating a first portion of the wafer and the second treatment includes heating a second portion of the wafer.

8. The epitaxial wafer of claim 1, wherein an average density of oxygen precipitates in the BMD layer following the visualization treatment and/or the second treatment is about $4 \times 10^8/cm^3$ or more.

9. The epitaxial wafer of claim 1 wherein the ratio is in a range of about 0.94 to 0.97.

10. A wafer, that is substantially free of crystal-originated-particle defects, comprising:
    a bulk micro defect (BMD) layer in which a ratio of a first average density of oxygen precipitates from a first treatment to a second average density of oxygen precipitates from a second treatment is in a range of about 0.82 to 1.02,
    wherein the first treatment includes heating the wafer at about 1150° C. for 2 minutes and then between about 950 to 1000° C. for 16 hours, and the second treatment includes heating the wafer at about 780° C. for 3 hours and then between about 950 to 1000° C. for 16 hours.

11. The wafer of claim 10 wherein a second ratio of the second average density to the first average density is in a range of about 0.98 to 1.22.

12. The wafer of claim 10 further comprising a denuded zone between the BMD layer and a surface of the wafer.

13. The wafer of claim 12 wherein the denuded zone has a width in a range of about 15 to 90 μm.

14. The wafer of claim 10 wherein a ratio of a maximum density of oxygen precipitates to a minimum density of oxygen precipitates is in a range of about 1.24 to 1.33, wherein each of the maximum density and the minimum density is taken along any radial direction from center to edge of the wafer at an interval of about 5 mm in the BMD layer.

15. The wafer of claim 10 wherein the first treatment includes heating a first portion of the wafer and the second treatment includes heating a second portion of the wafer.

16. The wafer of claim 10, wherein an average density of oxygen precipitates in the BMD layer following the first treatment and/or the second treatment is about $4 \times 10^8/cm^3$ or more.

17. The wafer of claim 10 wherein the ratio is in a range of about 0.95 to 1.02.

18. A wafer comprising:
    a bulk micro defect (BMD) layer in which a ratio of a first average density of oxygen precipitates from a first treatment to a second average density of oxygen precipitates from a second treatment is in a range of about 0.74 to 0.95,
    wherein the first treatment includes heating the wafer at about 1150° C. for 2 minutes and then between about 950 to 1000° C. for 16 hours, and the second treatment includes heating the wafer at about 780° C. for 3 hours and then between about 950 to 1000° C. for 16 hours.

19. The wafer of claim 18 wherein a second ratio of the second average density to the first average density is in a range of about 1.06 to 1.36.

20. The wafer of claim 18 further comprising a denuded zone between the BMD layer and a surface of the wafer.

21. The wafer of claim 20 wherein the denuded zone has a width in a range of about 15 to 90 μm.

22. The wafer of claim 18 wherein a ratio of a maximum density of oxygen precipitates to a minimum density of oxygen precipitates is in a range of about 1.23 to 1.30, wherein each of the maximum density and the minimum density is taken along any radial direction from center to edge of the wafer at an interval of about 5 mm in the BMD layer.

23. The wafer of claim 18 wherein the first treatment includes heating a first portion of the wafer and the second treatment includes heating a second portion of the wafer.

24. The wafer of claim 18, wherein an average density of oxygen precipitates in the BMD layer following the first treatment and/or the second treatment is about $4 \times 10^8/cm^3$ or more.

25. The wafer of claim 18 wherein the ratio is in a range of about 0.89 to 0.95.

26. A method of making a robust wafer comprising:
    heating a silicon wafer at a first temperature between about 1100° C. to 1200° C. inside a furnace having a non-oxidizing atmosphere for a first duration of about 1 to 30 seconds;
    heating the silicon wafer at a second temperature between about 800° C. to 975° C. for a second duration of about 2 to 10 minutes; and then
    heating the silicon wafer at a third temperature between about 1000° C. to 1200° C. for a third duration of about 1 to 10 minutes.

27. The method of claim 26 wherein the non-oxidizing atmosphere comprises an inert gas containing ammonia.

28. The method of claim 26 wherein the silicon wafer is heated from a room temperature to the first temperature at a rate of about 10 to 50° C./sec.

29. The method of claim 26 wherein the silicon wafer is cooled from the first temperature to the second temperature at a cooling rate of about 20 to 120° C./sec.

30. The method of claim 26 wherein heating the silicon wafer at the second temperature is performed in a non-oxidizing atmosphere using an inert gas without ammonia.

31. The method of claim 26 wherein the silicon wafer is heated from the second temperature to the third temperature at a rate of about 10 to 50° C./sec.

32. A wafer, substantially free of crystal-originated-particle defects, comprising:
    a bulk micro defect (BMD) layer in which a ratio of a first average density of oxygen precipitates from a first treatment to a second average density of oxygen precipitates from a second treatment is in a range of about 0.82 to 1.02,
    wherein the first treatment includes heating a first portion of the wafer at about 1150° C. for 2 minutes and then between about 950 to 1000° C. for 16 hours, and the second treatment includes heating a second portion of the wafer at about 780° C. for 3 hours and then between about 950 to 1000° C. for 16 hours.

33. The wafer of claim 32 wherein a second ratio of the second average density to the first average density is in a range of about 0.98 to 1.22.

34. The wafer of claim 32 further comprising a denuded zone between the BMD layer and a surface of the wafer.

35. The wafer of claim 34 wherein the denuded zone has a width in a range about 15 to 90 µm.

36. The wafer of claim 32 wherein a ratio of a maximum density of oxygen precipitates to a minimum density of oxygen precipitates is in a range of about 1.24 to 1.33, wherein each of the maximum density and the minimum density is taken along any radial direction from center to edge of the wafer at an interval of about 5 mm in the BMD layer.

37. The wafer of claim 32, wherein an average density of oxygen precipitates in the BMD layer following the first treatment and/or the second treatment is about $4\times10^8/cm^3$ or more.

38. The wafer of claim 32 wherein the ratio is in a range of about 0.95 to 1.02.

\* \* \* \* \*